(12) United States Patent
Malladi et al.

(10) Patent No.: US 12,099,781 B1
(45) Date of Patent: Sep. 24, 2024

(54) AUTOMATIC GENERATION OF DATA MODELS

(71) Applicant: Tyco Fire & Security GmbH, Neuhausen am Rheinfall (CH)

(72) Inventors: Sastry K M Malladi, Fremont, CA (US); Gregory A. Makowski, Los Altos, CA (US); Gary W. Gavin, Franklin, WI (US); Trent M. Swanson, Wellington, FL (US); Abu Bakr Khan, Franklin, WI (US); Thomas M. Seneczko, Milwaukee, WI (US); Miguel Galvez, Westford, MA (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 0 days.

(21) Appl. No.: 18/676,813

(22) Filed: May 29, 2024

Related U.S. Application Data

(60) Provisional application No. 63/469,804, filed on May 30, 2023.

(51) Int. Cl.
  *G06F 30/17* (2020.01)
(52) U.S. Cl.
  CPC .................. *G06F 30/17* (2020.01)

(58) Field of Classification Search
  CPC ........................................ G06F 30/17
  See application file for complete search history.

(56) References Cited

U.S. PATENT DOCUMENTS

| | | | |
|---|---|---|---|
| 2021/0073430 A1* | 3/2021 | Levy | G06F 30/18 |
| 2021/0200807 A1 | 7/2021 | Ploegert et al. | |
| 2023/0169220 A1 | 6/2023 | Ramanasankaran et al. | |
| 2023/0185983 A1 | 6/2023 | Ramanasankaran et al. | |
| 2023/0213909 A1 | 7/2023 | Galvez et al. | |
| 2024/0036537 A1 | 2/2024 | Gupta et al. | |
| 2024/0095460 A1* | 3/2024 | Xu | G06F 40/30 |
| 2024/0126227 A1 | 4/2024 | Kammela et al. | |

OTHER PUBLICATIONS

Gori V, Chen G, Jatkar H, Rovas D, Ruyssevelt P. Data-driven smart buildings: Narratives of drivers and barriers from real-world implementations. The Chartered Institution of Building Services Engineers (CIBSE). (Year: 2023).*
U.S. Appl. No. 18/438,195, filed Feb. 9, 2024, Lu et al.

* cited by examiner

*Primary Examiner* — Chuen-Meei Gan
(74) *Attorney, Agent, or Firm* — Foley & Lardner LLP

(57) ABSTRACT

Systems and methods to generate new equipment models and/or connectors to integrate the new equipment models are described herein. Generation of new equipment models can include retrieving information from one or more publicly accessible data sources.

16 Claims, 10 Drawing Sheets

AUTOMATIC GENERATION OF DATA MODELS

CROSS-REFERENCE TO RELATED PATENT APPLICATIONS

This application claims the benefit of and priority to U.S. Provisional Patent Application No. 63/469,804, filed on May 30, 2023, the entirety of which is incorporated by reference herein.

BACKGROUND

This application relates generally to a building system of a building. This application relates more particularly to systems for managing and processing data of the building system.

SUMMARY

At least one embodiment relates to a method. The method can include receiving, by one or more processors of a building management system, data for a new building device of a building. The method can include generating, by the one or more processors using an AI model, at least one of a new equipment model for the new building device or a new connector to integrate the new equipment model and/or other data regarding the new building device with other portions of the building management system. Generating the at least one of the new equipment model or the new connector can include the AI model identifying one or more information sources relating to the new building device using the data for the new building device and extracting data from the one or more information sources and utilizing the data extracted from the one or more information sources to generate the at least one of the new equipment model or the new connector. The AI model can generate the at least one of the new equipment model or the new connector in a predetermined format supported by the building management system. The method can include performing, by the one or more processors, one or more actions for the building using the at least one of the new equipment model or the new connector generated using the AI model.

In some embodiments, the AI model can include a generative large language model (LLM).

In some embodiments, the generative LLM can include a generative pretrained transformer model.

In some embodiments, the method can include determining, by the one or more processors using the AI model, that a preexisting equipment model and/or connector for the new building device is absent from the building management system. The method can include generating, by the one or more processors using the AI model responsive to determining that the preexisting equipment model and/or the connector for the new building device is absent from the building management system, the new equipment model and/or the new connector for the new building device.

In some embodiments, generating the new equipment model and/or the new connector for the new building device can be done autonomously and/or without manual user intervention.

In some embodiments, generating the new equipment model and/or the new connector for the new building device includes generating, by the one or more processors using the AI model, at least one of candidates for user selection or prompts for user selection.

In some embodiments, the other data regarding the new building device includes at least one of data indicating a building device type, data indicating a building device model, or data indicating operational information.

In some embodiments, the method can include receiving, by the one or more processors, a plurality of structured equipment models corresponding to a plurality of pieces of building equipment for a plurality of buildings. The plurality of structured equipment models can conform to a plurality of different predetermined formats and/or can include structured data not conforming to the predetermined format supported by the building management system. The method can include training, by the one or more processors, the AI model using the first plurality of structured equipment models to generate one or more new equipment models or one or more new connectors.

At least one embodiment relates to one or more non-transitory storage media. The one or more non-transitory storage media can store instructions thereon. The instructions can, when executed by one or more processors, cause the one or more processors to perform operations that include receiving a first plurality of structured equipment models corresponding to a first plurality of pieces of building equipment for a plurality of buildings. The first plurality of structured equipment models can conform to a plurality of different predetermined formats and/or comprising structured data not conforming to the plurality of different predetermined formats. The operations can include training a generative AI model using the first plurality of structured equipment models. The operations can include performing, using the generative AI model, one or more actions with respect to one or more new pieces of building equipment subsequent to training the generative AI model.

In some embodiments, performing the one or more actions with respect to the one or more new pieces of building equipment can include identifying one or more information sources relating to the one or more new pieces of building equipment, and generating, using data extracted from the one or more information sources, one or more new equipment models for the one or more new pieces of building equipment.

In some embodiments, the one or more new equipment models can conform to a predetermined format supported by a building management system that controls the one or more new pieces of building equipment.

In some embodiments, the operations can include receiving data for the one or more new pieces of building equipment. The operations can include generating, using the generative AI model, one or more new connectors to integrate one or more new equipment models with other portions of a building management system.

In some embodiments, the generative AI model can include a generative pretrained transformer model.

In some embodiments, performing the one or more actions with respect to the one or more new pieces of building equipment can include determining, using the generative AI model, that a preexisting equipment model and/or connector for the one or more new pieces of building equipment is absent from a building management system, and generating, using the generative AI model responsive to determining that the preexisting equipment model and/or the connector for the one or more new pieces of building equipment is absent from the building management system, one or more new equipment models and/or one or more new connectors for the one or more new pieces of building equipment.

In some embodiments, generating the one or more new equipment models and/or the one or more new connectors for the one or more new pieces of building equipment can be done autonomously and/or without manual user intervention.

In some embodiments, generating the one or more new equipment models and/or the one or more new connectors for the one or more new pieces of building equipment can include generating, using the generative AI model, at least one of candidates for user selection or prompts for user selection.

At least one embodiment relates to a system. The system can include one or more memory devices. The one or more memory devices can store instructions thereon. The instructions can, when executed by one or more processors, cause the one or more processors to receive data for a new building device of a building. The instructions can cause the one or more processors to generate, using an AI model, at least one of a new equipment model for the new building device or a new connector to integrate the new equipment model and/or other data regarding the new building device with other portions of a building management system. Generation of the at least one of the new equipment model or the new connector can include the AI model identifying one or more information sources relating to the new building device using the data for the new building device, and extracting data from the one or more information sources and utilizing the data extracted from the one or more information sources to generate the at least one of the new equipment model or the new connector. The AI model can generate the at least one of the new equipment model or the new connector in a predetermined format supported by the building management system. The instructions can cause the one or more processors to perform one or more actions for the building using the at least one of the new equipment model or the new connector generated using the AI model.

In some embodiments, the AI model can include a generative large language model (LLM).

In some embodiments, the generative LLM can include a generative pretrained transformer model.

In some embodiments, the instructions can cause the one or more processors to determine, using the AI model, that a preexisting equipment model and/or connector for the new building device is absent from the building management system. The instructions can cause the one or more processors to generate, using the AI model responsive to determining that the preexisting equipment model and/or the connector for the new building device is absent from the building management system, the new equipment model and/or the new connector for the new building device.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
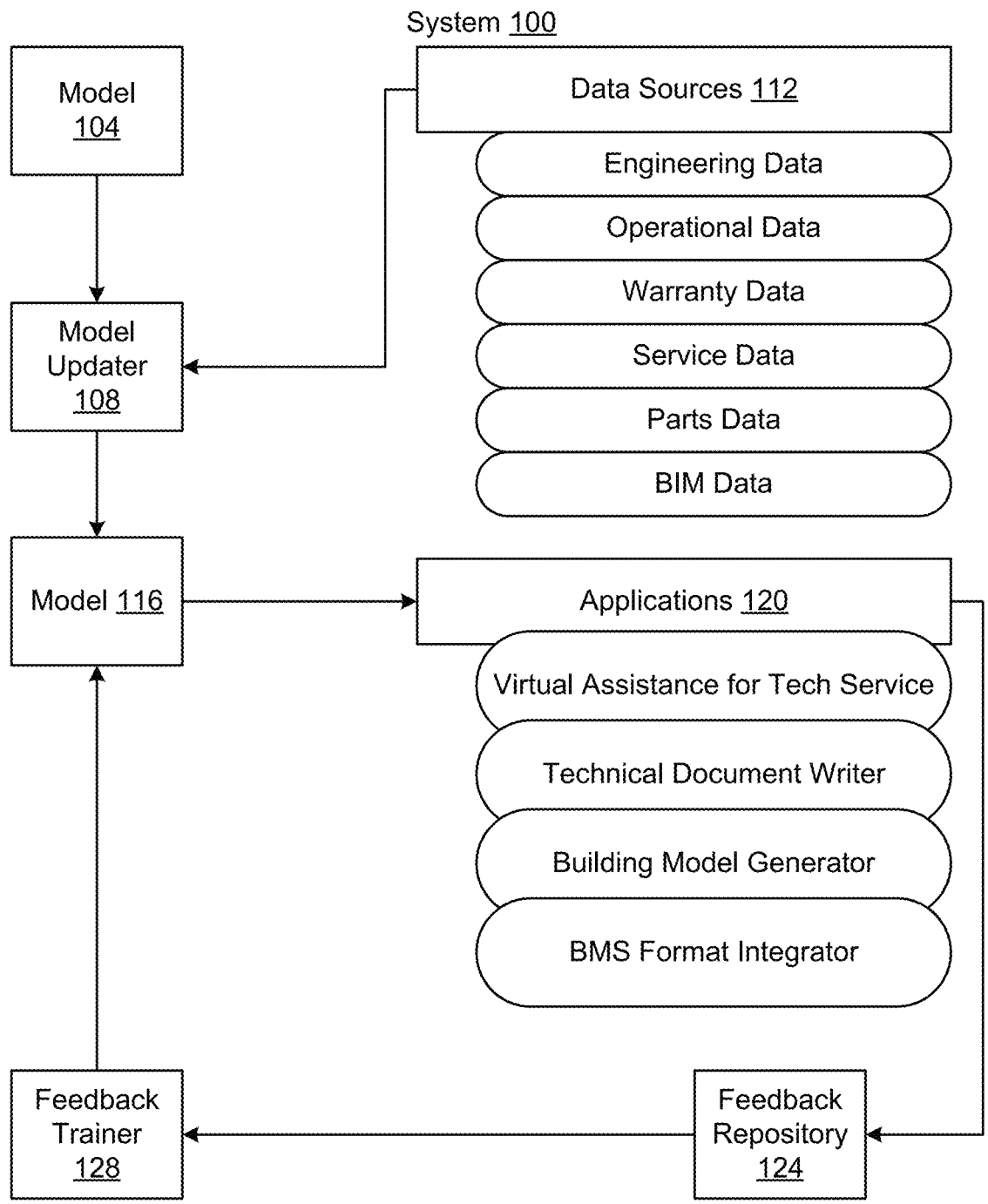
FIG. 1 is a block diagram of an example of a machine learning model-based system for equipment servicing applications.

Referring generally to the FIGURES, systems and methods in accordance with the present disclosure can implement various systems to precisely generate data relating to operations to be performed for managing building systems and components and/or items of equipment, including heating, ventilation, cooling, and/or refrigeration (HVAC-R) systems and components. For example, various systems described herein can be implemented to more precisely generate data for various applications including, for example and without limitation, virtual assistance for generating, detecting, identifying, and/or otherwise establishing models for pieces of building equipment. Various such applications can facilitate both asynchronous and real-time implementation, including by generating text data for such applications based on data from disparate data sources that may not have predefined database associations amongst the data sources, yet may be relevant at specific steps or points in time during service operations.

In some embodiments, the systems for and methods of generating, providing, and implementing digital building equipment models for pieces of building equipment can be executed and/or implemented using Artificial Intelligence (AI) and/or Machine Learning (ML). For example, an AI model can receive data pertaining to a recently installed piece of building equipment and the AI model can detect and/or generate a building equipment model (e.g., a digital representation) for the recently installed piece of building equipment. As described herein "digital building equipment models" and/or "equipment models" may refer to and/or include at least one of digital representations of building equipment, Building Information Models (BIMs) and/or BIM components, Building Automation Systems (BAS) and/or BAS components, entity graphs, and/or digital twins of building equipment.

A BAS is, in general, a system of devices configured to control, monitor, and manage equipment in or around a building or building area. A BAS can include, for example, a HVAC system, a security system, a lighting system, a fire alerting system, any other system that is capable of managing building functions or devices, or any combination thereof.

A BIM is a representation of the physical and/or functional characteristics of a building. A BIM may represent structural characteristics of the building (e.g., walls, floors, ceilings, doors, windows, etc.) as well as the systems or components contained within the building (e.g., lighting components, electrical systems, mechanical systems, HVAC components, furniture, plumbing systems or fixtures, etc.). In some embodiments, a BIM is a 3D graphical model of the building. A BIM may be created using computer modeling software or other computer-aided design (CAD) tools and may be used by any of a plurality of entities that provide building-related services.

In some embodiments, a BIM represents building components and/or building equipment as objects (e.g., software objects). For example, a BIM may include a plurality of objects that represent building equipment within the building as well as building spaces. Each object may include a collection of attributes that define the physical geometry of the object, the type of object, and/or other properties of the object. For example, objects representing building spaces may define the size and location of the building space. Objects representing physical components may define the geometry of the physical component, the type of component (e.g., lighting fixture, air handling unit, wall, etc.), the location of the physical component, a material from which the physical component is constructed, and/or other attributes of the physical component.

The AI model can manage operations systemically with buildings that have memory, intelligence, and unique identities. The AI model can perform energy and space optimization, predictive maintenance, and/or remote operations. While the AI model described herein pertains to buildings and entities of a building and/or building subsystems (e.g., for HVAC systems, security systems, access control systems, elevator systems, fire response systems, etc.), the AI model can be applied to other industries, e.g., motor vehicles, airports, manufacturing systems, transit systems, airplanes, and/or any other type of system where the management of devices is desired. The AI model can provide seamless integration of devices regardless of brand, make, model, or subsystem.

The AI model can also directly communicate with the building subsystems. The AI model can facilitate receiving, collecting, and/or retrieving data from the building subsystems. In some embodiments, the AI model can facilitate the command and control of the building systems. The AI model can facilitate message control for the building data platform. For example, the AI model can provide operational commands for the building subsystems to the building subsystems.

The AI model can facilitate the management of a digital twin of the building, e.g., the building subsystems. Digital twins can be digital replicas of physical entities that enable an in-depth analysis of data of the physical entities and provide the potential to monitor systems to mitigate risks, manage issues, and utilize simulations to test future solutions. Digital twins can play an important role in helping technicians find the root cause of issues and solve problems faster, in supporting safety and security protocols, and in supporting building managers in more efficient use of energy and other facilities resources. Digital twins can be used to enable and unify security systems, employee experience, facilities management, sustainability, etc.

The AI model can track the building subsystems by storing entities (e.g., data representing equipment, buildings, spaces, floors, software services, policies, etc.), relationships (e.g., relationships between equipment and their locations, API calls between software services, etc.), and events (e.g., data that has occurred, measurements, commands, statuses, etc.). The AI model can create graph projections, e.g., a graph with nodes for the entities and events of the building and edges for the relationships between the entities and/or events. The graph projections can be built on particular policies (e.g., what entities, events, and/or relationships should be included within the graph) and/or ontologies (the types of relationships that should be made with different types of entities and/or events). In this regard, particular graph projections can be generated for particular subscribers, users, systems, etc.

In some embodiments, the AI model can receive various types of information that correspond to pieces of building equipment. For example, the AI model can receive pictures, serial numbers, model numbers, specification sheets, manuals, product descriptions, and/or data point information. In some embodiments, the AI model can retrieve and/or access the information that corresponds to the pieces of building equipment. For example, the AI model may perform one or more application programming interface (API) calls to retrieve the information. As another example, the AI model can receive the information via one or more inputs.

In some embodiments, the AI model can generate one or more predictions regarding the pieces of building equipment based on the information that corresponds to the pieces of building equipment. For example, the AI model can identify, based on the information, that given piece of building equipment is an air handler unit (AHU). Responsive to identifying that the given piece of building equipment is an AHU, the AI model generate predictions regarding various equipment that can be associated with and/or related to the AHU. For example, the AI model can predict that the AHU includes air sensors and dampers based on a specification sheet including information that indicates that the given AHU includes the air sensors and dampers. As another example, the AI model can predict given data points that the AHU may produce (e.g., what type of data or information does the AHU produce and/or provide).

In some embodiments, the AI model can implement and/or produce an optimization plan for the pieces of building equipment responsive to identification of the pieces of building equipment. For example, the AI model can retrieve a fine-tuned and configured optimization plan that corresponds to an identity of a given piece of building equipment. The AI model can retrieve given optimization plans for AHUs responsive to identifying the AHUs.

In some embodiments, the building may be at least one of a commercial building, a medical facility (e.g., a hospital, a clinic, an assisted living facility, a nursing home, etc.), a residential complex (e.g., an apartment complex, condos, etc.), an educational building (e.g., schools, college campus buildings, etc.), mixed use buildings (e.g., stores/shops occupy a portion of the building and residential areas occupy a portion of the building), and/or among other possible combinations. For example, the building may be an office building and the office building may include multiple floors having multiple zones and/or multiple rooms.

In some systems, pieces of building equipment can be supported by text information, such as predefined text documents such as service, diagnostic, troubleshooting guides, manuals, online resources, API documentation, among otherwise types of documentation. Various such text information may not be useful for specific building equipment integration (e.g., adding a recently installed piece of building equipment into a digital environment and/or a digital representation of the building). For example, the text information may correspond to different items of equipment or versions of items of equipment previously installed in the building. The text information, being predefined, may not account for specific technical issues that may be present in the recently installed pieces of building equipment.

AI and/or ML systems, including but not limited to Large Language Models (LLMs), can be used to generate text data and data of other modalities in a more responsive manner to real-time conditions, including generating strings of text data that may not be provided in the same manner in existing documents, yet may still meet criteria for useful text information, such as relevance, style, and coherence. For example, LLMs can predict text data based at least on inputted prompts and by being configured (e.g., trained, modified, updated, fine-tuned) according to training data representative of the text data to predict or otherwise generate.

However, various considerations may limit the ability of such systems to precisely generate appropriate data for specific conditions. For example, due to the predictive nature of the generated data, some LLMs may generate text data that is incorrect, imprecise, or not relevant to the specific conditions. Using the LLMs may require a user to manually vary the content and/or syntax of inputs provided to the LLMs (e.g., vary inputted prompts) until the output of the LLMs meets various objective or subjective criteria of the user. The LLMs can have token limits for sizes of inputted text during training and/or runtime/inference operations (and relaxing or increasing such limits may require increased computational processing, API calls to LLM services, and/or memory usage), limiting the ability of the LLMs to be effectively configured or operated using large amounts of raw data or otherwise unstructured data.

Systems and methods in accordance with the present disclosure can use machine learning models, including LLMs and other generative AI systems, to capture data, including but not limited to unstructured knowledge from various data sources, and process the data to accurately generate outputs, such as completions responsive to prompts, including in structured data formats for various applications and use cases. The system can implement various automated and/or expert-based thresholds and data quality management processes to improve the accuracy and quality of generated outputs and update training of the machine learning models accordingly. The system can enable real-time messaging and/or conversational interfaces for users to provide field data regarding equipment to the system (including presenting targeted queries to users that are expected to elicit relevant responses for efficiently receiving useful response information from users) and guide users, such as service technicians and/or equipment installers, through relevant integration, implementation, and/or facilitation of adding pieces of building equipment in a Building Management System (BMS).

This can include, for example, receiving data from integration reports in various formats, including various modalities and/or multi-modal formats (e.g., text, speech, audio, image, and/or video). The system can facilitate automated, flexible customer report generation, such as by processing information received from equipment installers and other users into a standardized format, which can reduce the constraints on how the user submits data while improving resulting reports. The system can couple unstructured building equipment data to other input/output data sources and analytics, such as to relate unstructured data with outputs of timeseries data from equipment (e.g., sensor data; report logs) and/or outputs from models or algorithms of equipment operation, which can facilitate more accurate analytics, prediction services, equipment identification, and/or equipment integration. The system can receive, from a technician in the field integration a new piece of building equipment into the BMS, feedback regarding the accuracy of identifying the new piece of building equipment, as well as feedback regarding how the service technician evaluated information about the identification of the new piece of building equipment (e.g., what data did they evaluate; what did they inspect; did the detected building equipment identification accurately match the type of equipment, etc.), which can be used to update the root cause prediction model.

For example, the system can provide a platform for generating building equipment models for newly added pieces of building equipment that are not presently represented in the BMS in which a machine learning model is configured based on connecting or relating unstructured data and/or semantic data, such as human feedback and written/spoken reports, with time-series product data regarding items of equipment, so that the machine learning model can more accurately generate a building equipment model for the newly added pieces of building equipment. For instance, responsive to the installation of a chiller, the system can more accurately detect and/or generate a building equipment model for integration of the chiller with the digital environment and/or digital representation of the building; the system can request feedback from the technician regarding the equipment model for the chiller, such as whether the equipment model correctly correlated to the chiller, as well as the information that the technician used to evaluate the correctness or accuracy of the equipment model; the system can use this feedback to modify the machine learning models, which can increase the accuracy of the machine learning models.

In some instances, significant computational resources (or human user resources) can be required to process data relating to equipment operation, such as time-series product data and/or sensor data, to detect or identify pieces of building equipment. In addition, it can be resource-intensive to label such data with identifiers of given equipment types and/or operational parameters, which can make it difficult to generate machine learning training data from such data. Systems and methods in accordance with the present disclosure can leverage the efficiency of language models (e.g., GPT-based models or other pre-trained LLMs) in extracting semantic information (e.g., semantic information identifying pieces of building equipment, models pertaining to pieces of building equipment, and other accurate expert knowledge regarding building equipment models) from the unstructured data in order to use both the unstructured data and the data relating to equipment operation to generate more accurate outputs regarding building equipment models. As such, by implementing language models using various operations and processes described herein, building management and equipment integration systems can take advantage of the causal/semantic associations between the unstructured data and the data relating to equipment operation, and the language models can allow these systems to more efficiently extract these relationships in order to more accurately predict targeted, useful information for detecting building equipment models during the installation process. While various implementations are described as being implemented using generative AI models such as transformers and/or GANs, in some embodiments, various features described herein can be implemented using non-generative AI models or even without using AI/machine learning, and all such modifications fall within the scope of the present disclosure.

The system can enable a generative AI-based service wizard interface. For example, the interface can include user interface and/or user experience features configured to provide a question/answer-based input/output format, such as a conversational interface, that directs users through providing targeted information for accurately generating building equipment models, presenting candidates (e.g., detected and/or generated equipment models), or presenting instructions for integration the equipment models into the BMS. The system can use the interface to present information regarding identifiers (e.g., model type, serial number, part number, model number etc.) and where the identifiers may be located on the building equipment, as well as instructions for how to use the identifiers to generate the building equipment models.

In various implementations, the systems can include a plurality of machine learning models that may be configured using integrated or disparate data sources. This can facilitate more integrated user experiences or more specialized (and/or lower computational usage for) data processing and output generation. Outputs from one or more first systems, such as one or more first algorithms or machine learning models, can be provided at least as part of inputs to one or more second systems, such as one or more second algorithms or machine learning models. For example, a first language model can be configured to process unstructured inputs (e.g., text, speech, images, etc.) into a structure output format compatible for use by a second system, such as a building equipment model generation algorithm or equipment configuration model.

The system can be used to automate interventions for equipment integration, equipment operation, servicing, fault detection and diagnostics (FDD), and alerting operations. For example, by being configured to perform operations such as equipment model detection, the system can monitor data regarding the building equipment to predict default operational parameters for the building equipment. The system can present to a technician or manager of the equipment a report regarding the detection (e.g., information pertaining to the building equipment model) and requesting feedback regarding the accuracy of the detection, which can be used to update the machine learning models to more accurately generate and/or detect building equipment models.

Machine Learning Models for Building Equipment Models

FIG. 1 depicts an example of a system 100. The system 100 can implement various operations for configuring (e.g., training, updating, modifying, transfer learning, fine-tuning, etc.) and/or operating various AI and/or ML systems, such as neural networks of LLMs or other generative AI systems. The system 100 can be used to implement various generative AI-based building equipment modeling operations.

For example, the system 100 can be implemented for operations associated with any of a variety of building management systems (BMSs) or equipment or components thereof. A BMS can include a system of devices that can control, monitor, and manage equipment in or around a building or building area. The BMS can include, for example, a HVAC system, a security system, a lighting system, a fire alerting system, any other system that is capable of managing building functions or devices, or any combination thereof. The BMS can include or be coupled with items of equipment, for example and without limitation, such as heaters, chillers, boilers, air handling units, sensors, actuators, refrigeration systems, fans, blowers, heat exchangers, energy storage devices, condensers, valves, or various combinations thereof.

The items of equipment can operate in accordance with various qualitative and quantitative parameters, variables, setpoints, and/or thresholds or other criteria, for example. In some instances, the system 100 and/or the items of equipment can include or be coupled with one or more controllers for controlling parameters of the items of equipment, such as to receive control commands for controlling operation of the items of equipment via one or more wired, wireless, and/or user interfaces of controller.

Various components of the system 100 or portions thereof can be implemented by one or more processors coupled with or more memory devices (memory). The processors can be a general purpose or specific purpose processors, an application specific integrated circuit (ASIC), one or more field programmable gate arrays (FPGAs), a group of processing components, or other suitable processing components. The processors may be configured to execute computer code and/or instructions stored in the memories or received from other computer readable media (e.g., CDROM, network storage, a remote server, etc.). The processors can be configured in various computer architectures, such as graphics processing units (GPUs), distributed computing architectures, cloud server architectures, client-server architectures, or various combinations thereof. One or more first processors can be implemented by a first device, such as an edge device, and one or more second processors can be implemented by a second device, such as a server or other device that is communicatively coupled with the first device and may have greater processor and/or memory resources.

The memories can include one or more devices (e.g., memory units, memory devices, storage devices, etc.) for storing data and/or computer code for completing and/or facilitating the various processes described in the present disclosure. The memories can include random access memory (RAM), read-only memory (ROM), hard drive storage, temporary storage, non-volatile memory, flash memory, optical memory, or any other suitable memory for storing software objects and/or computer instructions. The memories can include database components, object code components, script components, or any other type of information structure for supporting the various activities and information structures described in the present disclosure. The memories can be communicably connected to the processors and can include computer code for executing (e.g., by the processors) one or more processes described herein.

Machine Learning Models

The system 100 can include or be coupled with one or more first models 104. The first model 104 can include one or more neural networks, including neural networks configured as generative models. For example, the first model 104 can predict or generate new data (e.g., artificial data; synthetic data; data not explicitly represented in data used for configuring the first model 104). The first model 104 can generate any of a variety of modalities of data, such as text, speech, audio, images, and/or video data. The neural network can include a plurality of nodes, which may be arranged in layers for providing outputs of one or more nodes of one layer as inputs to one or more nodes of another layer. The neural network can include one or more input layers, one or more hidden layers, and one or more output layers. Each node can include or be associated with parameters such as weights, biases, and/or thresholds, representing how the node can perform computations to process inputs to generate outputs. The parameters of the nodes can be configured by various learning or training operations, such as unsupervised learning, weakly supervised learning, semi-supervised learning, or supervised learning.

The first model 104 can include, for example and without limitation, one or more language models, LLMs, attention-based neural networks, transformer-based neural networks, generative pretrained transformer (GPT) models, bidirectional encoder representations from transformers (BERT) models, encoder/decoder models, sequence to sequence models, autoencoder models, generative adversarial networks (GANs), convolutional neural networks (CNNs), recurrent neural networks (RNNs), diffusion models (e.g., denoising diffusion probabilistic models (DDPMs)), or various combinations thereof.

For example, the first model 104 can include at least one GPT model. The GPT model can receive an input sequence and can parse the input sequence to determine a sequence of tokens (e.g., words or other semantic units of the input sequence, such as by using Byte Pair Encoding tokenization). The GPT model can include or be coupled with a vocabulary of tokens, which can be represented as a one-hot encoding vector, where each token of the vocabulary has a corresponding index in the encoding vector; as such, the GPT model can convert the input sequence into a modified input sequence, such as by applying an embedding matrix to the token tokens of the input sequence (e.g., using a neural network embedding function), and/or applying positional encoding (e.g., sin-cosine positional encoding) to the tokens of the input sequence. The GPT model can process the modified input sequence to determine a next token in the sequence (e.g., to append to the end of the sequence), such as by determining probability scores indicating the likelihood of one or more candidate tokens being the next token and selecting the next token according to the probability scores (e.g., selecting the candidate token having the highest probability scores as the next token). For example, the GPT model can apply various attention and/or transformer based operations or networks to the modified input sequence to identify relationships between tokens for detecting the next token to form the output sequence.

The first model 104 can include at least one diffusion model, which can be used to generate image and/or video data. For example, the diffusional model can include a denoising neural network and/or a denoising diffusion probabilistic model neural network. The denoising neural network can be configured by applying noise to one or more training data elements (e.g., images, video frames) to generate noised data, providing the noised data as input to a candidate denoising neural network, causing the candidate denoising neural network to modify the noised data according to a denoising schedule, evaluating a convergence condition based on comparing the modified noised data with the training data instances, and modifying the candidate denoising neural network according to the convergence condition (e.g., modifying weights and/or biases of one or more layers of the neural network). In some implementations, the first model 104 includes a plurality of generative models, such as GPT and diffusion models, that can be trained separately or jointly to facilitate generating multi-modal outputs, such as technical documents (e.g., service guides, equipment manuals, specification sheets, etc.) that include both text and image/video information.

In some implementations, the first model 104 can be configured using various unsupervised and/or supervised training operations. The first model 104 can be configured using training data from various domain-agnostic and/or domain-specific data sources, including but not limited to various forms of text, speech, audio, image, and/or video data, or various combinations thereof. The training data can include a plurality of training data elements (e.g., training data instances). Each training data element can be arranged in structured or unstructured formats; for example, the training data element can include an example output mapped to an example input, such as a query representing a service request or one or more portions of a service request, and a response representing data provided responsive to the query. The training data can include data that is not separated into input and output subsets (e.g., for configuring the first model 104 to perform clustering, classification, or other unsupervised ML operations). The training data can include human-labeled information, including but not limited to feedback regarding outputs of the models 104, 116. This can allow the system 100 to generate more human-like outputs.

In some implementations, the training data includes data relating to building management systems. For example, the training data can include examples of HVAC-R data, such as operating manuals, technical data sheets, configuration settings, operating setpoints, diagnostic guides, troubleshooting guides, user reports, technician reports. In some implementations, the training data used to configure the first model 104 includes at least some publicly accessible data, such as data retrievable via the Internet. In some embodiments, the training data includes entity data describing attributes of various entities and the relationships (e.g., connectors and/or connections) between the entities. The entities can be and/or include various pieces of building of equipment and various spaces, rooms, zones, and/or floors of the building (e.g., portions and/or areas of the building that are serviced by the pieces of building equipment). In some embodiments, the training data can include operational data, dynamic data and/or timeseries data (e.g., sensor measurements, status indications, alerts, notifications, etc.) pertaining to various pieces of building equipment.

Referring further to FIG. 1, the system 100 can configure the first model 104 to determine one or more second models 116. For example, the system 100 can include a model updater 108 that configures (e.g., trains, updates, modifies, fine-tunes, etc.) the first model 104 to determine the one or more second models 116. In some implementations, the second model 116 can be used to provide application-specific outputs, such as outputs having greater precision, accuracy, or other metrics, relative to the first model, for targeted applications.

The second model 116 can be similar to the first model 104. For example, the second model 116 can have a similar or identical backbone or neural network architecture as the first model 104. In some implementations, the first model 104 and the second model 116 each include generative AI machine learning models, such as LLMs (e.g., GPT-based LLMs) and/or diffusion models. The second model 116 can be configured using processes analogous to those described for configuring the first model 104.

In some implementations, the model updater 108 can perform operations on at least one of the first model 104 or the second model 116 via one or more interfaces, such as application programming interfaces (APIs). For example, the models 104, 116 can be operated and maintained by one or more systems separate from the system 100. The model updater 108 can provide training data to the first model 104, via the API, to determine the second model 116 based on the first model 104 and the training data. The model updater 108 can control various training parameters or hyperparameters (e.g., learning rates, etc.) by providing instructions via the API to manage configuring the second model 116 using the first model 104.

Data Sources

The model updater 108 can determine the second model 116 using data from one or more data sources 112. For example, the system 100 can determine the second model 116 by modifying the first model 104 using data from the one or more data sources 112. The data sources 112 can include or be coupled with any of a variety of integrated or disparate databases, data warehouses, digital twin data structures (e.g., digital twins of items of equipment or building management systems or portions thereof), data lakes, data repositories, documentation records, or various combinations thereof. In some implementations, the data sources 112 include HVAC-R data in any of text, speech, audio, image, or video data, or various combinations thereof, such as data associated with HVAC-R components and procedures including but not limited to installation, operation, configuration, repair, servicing, diagnostics, and/or troubleshooting of HVAC-R components and systems. Various data described below with reference to data sources 112 may be provided in the same or different data elements and may be updated at various points. The data sources 112 can include or be coupled with items of equipment (e.g., where the items of equipment output data for the data sources 112, such as sensor data, etc.). The data sources 112 can include various online and/or social media sources, such as blog posts or data submitted to applications maintained by entities that manage the buildings. The system 100 can determine relations between data from different sources, such as by using timeseries information and identifiers of the sites or buildings at which items of equipment are present to detect relationships between various different data relating to the items of equipment (e.g., to train the models 104, 116 using both timeseries data (e.g., sensor data; outputs of algorithms or models, etc.) regarding a given item of equipment and freeform natural language reports regarding the given item of equipment).

The data sources 112 can include unstructured data or structured data (e.g., data that is labeled with or assigned to one or more predetermined fields or identifiers). For example, using the first model 104 and/or the second model 116 to process the data can allow the system 100 to extract useful information from data in a variety of formats, including unstructured/freeform formats, which can allow service technicians and/or equipment installers to input information in less burdensome formats. The data can be of any of a plurality of formats (e.g., text, speech, audio, image, video, etc.), including multi-modal formats. For example, the data may be received from service technicians in forms such as text (e.g., laptop/desktop or mobile application text entry), audio, and/or video (e.g., dictating findings while capturing video).

The data sources 112 can include engineering data regarding one or more items of equipment. The engineering data can include manuals, such as installation manuals, instruction manuals, or operating procedure guides. The engineering data can include specifications or other information regarding operation of items of equipment. The engineering data can include engineering drawings, process flow diagrams, refrigeration cycle parameters (e.g., temperatures, pressures), or various other information relating to structures and functions of items of equipment.

In some implementations, the data sources 112 can include operational data regarding one or more items of equipment. The operational data can represent detected information regarding items of equipment, such as sensor data, logged data, user reports, or technician reports. The operational data can include, for example, service tickets generated responsive to requests for service, work orders, data from digital twin data structures maintained by an entity of the item of equipment, outputs or other information from equipment operation models (e.g., chiller vibration models), or various combinations thereof. Logged data, user reports, service tickets, billing records, time sheets, and various other such data can provide temporal information, such as how long service operations may take, or durations of time between service operations, which can allow the system 100 to predict resources to use for performing service as well as when to request service.

The data sources 112 can include, for instance, warranty data. The warranty data can include warranty documents or agreements that indicate conditions under which various entities associated with items of equipment are to provide service, repair, or other actions corresponding to items of equipment, such as actions corresponding to service requests.

The data sources 112 can include service data. The service data can include data from any of various service providers, such as service reports. The service data can indicate service procedures performed, including associated service procedures with initial service requests and/or sensor data related conditions to trigger service and/or sensor data measured during service processes.

In some implementations, the data sources 112 can include parts data, including but not limited to parts usage and sales data. For example, the data sources 112 can indicate various parts associated with installation or repair of items of equipment. The data sources 112 can indicate tools for performing service and/or installing parts.

In some embodiments, the data sources 112 can include BIM data, including but not limited to digital representations of building and/or components of the building (e.g., pieces of equipment, layouts, configurations, building specs, blueprints, design choices, building information model (BIM) files, HVAC systems in the building, lighting systems in the building, materials of walls, floors, ceilings, windows, etc., planned wall and floor thicknesses, etc.

The system 100 can include, with the data of the data sources 112, labels to facilitate cross-reference between items of data that may relate to common items of equipment, sites, service technicians, customers, or various combinations thereof. For example, data from disparate sources may be labeled with time data, which can allow the system 100 (e.g., by configuring the models 104, 116) to increase a likelihood of associating information from the disparate sources due to the information being detected or recorded (e.g., as service reports) at the same time or near in time.

For example, the data sources 112 can include data that can be particular to specific or similar items of equipment, buildings, equipment configurations, environmental states, or various combinations thereof. In some implementations, the data includes labels or identifiers of such information, such as to indicate locations, weather conditions, timing information, uses of the items of equipment or the buildings or sites at which the items of equipment are present, etc. This can enable the models 104, 116 to detect patterns of usage (e.g., spikes; troughs; seasonal or other temporal patterns) or other information that may be useful for determining causes of issues or causes of service requests, or predict future issues, such as to allow the models 104, 116 to be trained using information indicative of causes of issues across multiple items of equipment (which may have the same or similar causes even if the data regarding the items of equipment is not identical). For example, an item of equipment may be at a site that is a museum; by relating site usage or occupancy data with data regarding the item of equipment, such as sensor data and service reports, the system 100 can configure the models 104, 116 to determine a high likelihood of issues occurring before events associated with high usage (e.g., gala, major exhibit opening), and can generate recommendations to perform diagnostics or servicing prior to the events.

Model Configuration

Referring further to FIG. 1, the model updater 108 can perform various machine learning model configuration/training operations to determine the second model(s) 116 using the data from the data sources 112. For example, the model updater 108 can perform various updating, optimization, retraining, reconfiguration, fine-tuning, or transfer learning operations, or various combinations thereof, to determine the second model(s) 116. The model updater 108 can configure the second model(s) 116, using the data sources 112, to generate outputs (e.g., completions) in response to receiving inputs (e.g., prompts), where the inputs and outputs can be analogous to data of the data sources 112.

For example, the model updater 108 can identify one or more parameters (e.g., weights and/or biases) of one or more layers of the first model 104, and maintain (e.g., freeze, maintain as the identified values while updating) the values of the one or more parameters of the one or more layers. In some implementations, the model updater 108 can modify the one or more layers, such as to add, remove, or change an output layer of the one or more layers, or to not maintain the values of the one or more parameters. The model updater 108 can select at least a subset of the identified one or parameters to maintain according to various criteria, such as user input or other instructions indicative of an extent to which the first model 104 is to be modified to determine the second model 116. In some implementations, the model updater 108 can modify the first model 104 so that an output layer of the first model 104 corresponds to output to be determined for applications 120.

Responsive to selecting the one or more parameters to maintain, the model updater 108 can apply, as input to the second model 116 (e.g., to a candidate second model 116, such as the modified first model 104, such as the first model 104 having the identified parameters maintained as the identified values), training data from the data sources 112. For example, the model updater 108 can apply the training data as input to the second model 116 to cause the second model 116 to generate one or more candidate outputs.

The model updater 108 can evaluate a convergence condition to modify the candidate second model 116 based at least on the one or more candidate outputs and the training data applied as input to the candidate second model 116. For example, the model updater 108 can evaluate an objective function of the convergence condition, such as a loss function (e.g., L1 loss, L2 loss, root mean square error, cross-entropy or log loss, etc.) based on the one or more candidate outputs and the training data; this evaluation can indicate how closely the candidate outputs generated by the candidate second model 116 correspond to the ground truth represented by the training data. The model updater 108 can use any of a variety of optimization algorithms (e.g., gradient descent, stochastic descent, Adam optimization, etc.) to modify one or more parameters (e.g., weights or biases of the layer(s) of the candidate second model 116 that are not frozen) of the candidate second model 116 according to the evaluation of the objective function. In some implementations, the model updater 108 can use various hyperparameters to evaluate the convergence condition and/or perform the configuration of the candidate second model 116 to determine the second model 116, including but not limited to hyperparameters such as learning rates, numbers of iterations or epochs of training, etc.

As described further herein with respect to applications 120, in some implementations, the model updater 108 can select the training data from the data of the data sources 112 to apply as the input based at least on a particular application of the plurality of applications 120 for which the second model 116 is to be used for. For example, the model updater 108 can select data from the parts data source 112 for the building model generator application 120 or select various combinations of data from the data sources 112 (e.g., engineering data, operational data, and service data) for the building model generator application 120. The model updater 108 can apply various combinations of data from various data sources 112 to facilitate configuring the second model 116 for one or more applications 120.

In some implementations, the system 100 can perform at least one of conditioning, classifier-based guidance, or classifier-free guidance to configure the second model 116 using the data from the data sources 112. For example, the system 100 can use classifiers associated with the data, such as identifiers of the item of equipment, a type of the item of equipment, a type of entity operating the item of equipment, a site at which the item of equipment is provided, or a history of issues at the site, to condition the training of the second model 116. For example, the system 100 combine (e.g., concatenate) various such classifiers with the data for inputting to the second model 116 during training, for at least a subset of the data used to configure the second model 116, which can enable the second model 116 to be responsive to analogous information for runtime/inference time operations.

Applications

Referring further to FIG. 1, the system 100 can use outputs of the one or more second models 116 to implement one or more applications 120. For example, the second model(s) 116, having been configured using data from the data sources 112, can be capable of precisely generating outputs that represent useful, timely, and/or real-time information for the applications 120. In some implementations, each application 120 is coupled with a corresponding second model 116 that is specifically configured to generate outputs for use by the application 120. Various applications 120 can be coupled with one another, such as to provide outputs from a first application 120 as inputs or portions of inputs to a second application 120.

The applications 120 can include any of a variety of desktop, web-based/browser-based, or mobile applications. For example, the applications 120 can be implemented by enterprise management software systems, employee or other user applications (e.g., applications that relate to BMS functionality such as temperature control, user preferences, conference room scheduling, etc.), equipment portals that provide data regarding items of equipment, or various combinations thereof. The applications 120 can include user interfaces, wizards, checklists, conversational interfaces, chatbots, configuration tools, or various combinations thereof. The applications 120 can receive an input, such as a prompt (e.g., from a user), provide the prompt to the second model 116 to cause the second model 116 to generate an output, such as a completion in response to the prompt, and present an indication of the output. The applications 120 can receive inputs and/or present outputs in any of a variety of presentation modalities, such as text, speech, audio, image, and/or video modalities. For example, the applications 120 can receive unstructured or freeform inputs from a user, such as a service technician, and generate reports in a standardized format, such as a customer-specific format. This can allow, for example, technicians to automatically, and flexibly, generate customer-ready reports after service visits without requiring strict input by the technician or manually sitting down and writing reports; to receive inputs as dictations in order to generate reports; to receive inputs in any form or a variety of forms, and use the second model 116 (which can be trained to cross-reference metadata in different portions of inputs and relate together data elements) to generate output reports (e.g., the second model 116, having been configured with data that includes time information, can use timestamps of input from dictation and timestamps of when an image is taken, and place the image in the report in a target position or label based on time correlation).

In some implementations, the applications 120 include at least one virtual assistant (e.g., virtual assistance for technician services) application 120. The virtual assistant application can provide various services to support technician operations, such as presenting information from service requests, receiving queries regarding actions to perform to service items of equipment, and presenting responses indicating actions to perform to service items of equipment. The virtual assistant application can receive information regarding an item of equipment to be serviced, such as sensor data, text descriptions, or camera images, and process the received information using the second model 116 to generate corresponding responses.

For example, the virtual assistant application 120 can be implemented in a UI/UX wizard configuration, such as to provide a sequence of requests for information from the user (the sequence may include requests that are at least one of predetermined or dynamically generated responsive to inputs from the user for previous requests). For example, the virtual assistant application 120 can provide one or more requests for users such as service technicians, facility managers, or other occupants, and provide the received responses to at least one of the second model 116 or a root cause detection function (e.g., algorithm, model, data structure mapping inputs to candidate causes, etc.) to determine a prediction of a cause of the issue of the item of equipment and/or solutions. The virtual assistant application 120 can use requests for information such as for unstructured text by which the user describes characteristics of the item of equipment relating to the issue; answers expected to correspond to different scenarios indicative of the issue; and/or image and/or video input (e.g., images of problems, equipment, spaces, etc. that can provide more context around the issue and/or configurations). For example, responsive to receiving a response via the virtual assistant application 120 indicating that the problem is with temperature in the space, the system 100 can request, via the virtual assistant application 120, information regarding HVAC-R equipment associated with the space, such as pictures of the space, an air handling unit, a chiller, or various combinations thereof.

The virtual assistant application 120 can include a plurality of applications 120 (e.g., variations of interfaces or customizations of interfaces) for a plurality of respective user types. For example, the virtual assistant application 120 can include a first application 120 for a customer user, and a second application 120 for a service technician user. The virtual assistant applications 120 can allow for updating and other communications between the first and second applications 120 as well as the second model 116. Using one or more of the first application 120 and the second application 120, the system 100 can manage continuous/real-time conversations for one or more users, and evaluate the users' engagement with the information provided (e.g., did the user, customer, service technician, etc., follow the provided steps for responding to the issue or performing service, did the user discontinue providing inputs to the virtual assistant application 120, etc.), such as to enable the system 100 to update the information generated by the second model 116 for the virtual assistant application 120 according to the engagement. In some implementations, the system 100 can use the second model 116 to detect sentiment of the user of the virtual assistant application 120, and update the second model 116 according to the detected sentiment, such as to improve the experience provided by the virtual assistant application 120.

The applications 120 can include at least one document writer application 120, such as a technical document writer. The document writer application 120 can facilitate preparing structured (e.g., form-based) and/or unstructured documentation, such as documentation associated with service requests. For example, the document writer application 120 can present a user interface corresponding to a template document to be prepared that is associated with at least one of a service request or the item of equipment for which the service request is generated, such as to present one or more predefined form sections or fields. The document writer application 120 can use inputs, such as prompts received from the users and/or technical data provided by the user regarding the item of equipment, such as sensor data, text descriptions, or camera images, to generate information to include in the documentation. For example, the document writer application 120 can provide the inputs to the second model 116 to cause the second model 116 to generate completions for text information to include in the fields of the documentation.

In some implementations, the applications 120 include at least one building model generator application 120. The building model generator application can provide various services to support building equipment install and/or building equipment identification operations, such as presenting information from equipment install requests, receiving queries regarding actions to perform to install the items of equipment, and presenting responses indicating actions to perform to install the items of equipment. The building model generator application can receive information regarding an item of equipment to be installed, such as sensor data, text descriptions, or camera images, and process the received information using the second model 116 to generate corresponding responses.

For example, the building model generator application 120 can be implemented in a UI/UX wizard configuration, such as to provide a sequence of requests for information from the user (the sequence may include requests that are at least one of predetermined or dynamically generated responsive to inputs from the user for previous requests). For example, the building model generator application 120 can provide one or more requests for users such as service technicians, equipment installers, facility managers, or other occupants, and provide the received responses to at least one of the second model 116 or a building equipment detection function (e.g., algorithm, model, data structure mapping inputs to candidate causes, etc.) to determine and/or generator a building model of a recently installed piece of building equipment. The building model generator application 120 can use requests for information such as for unstructured text by which the user describes characteristics of the item of equipment relating to the installed piece of equipment; answers expected to correspond to different scenarios indicative of the installed piece of equipment; and/or image and/or video input (e.g., images of identification information for the equipment, spaces, etc. that can provide more context around the install, placement, and/or configuration of the equipment). For example, responsive to receiving a response via the building model generator indicating that a new AHU unit has been installed in the building, the system 100 can request, via the building model generator application 120, information regarding AHU equipment installed in various locations of the building and/or pictures of the space, pictures of the installed AHU, information about the installed AHU, and/or various combinations thereof.

The building model generator application 120 can include a plurality of applications 120 (e.g., variations of interfaces or customizations of interfaces) for a plurality of respective user types. For example, the building model generator application 120 can include a first application 120 for a customer user, and a second application 120 for a service technician user. The building model generator applications 120 can allow for updating and other communications between the first and second applications 120 as well as the second model 116. Using one or more of the first application 120 and the second application 120, the system 100 can manage continuous/real-time conversations for one or more users, and evaluate the users' engagement with the information provided (e.g., did the user, customer, service technician, etc., follow the provided steps for identifying and/or detecting the installed piece of building equipment, did the user discontinue providing inputs to the building model generator application 120, etc.), such as to enable the system 100 to update the information generated by the second model 116 for the building model generator application 120 according to the engagement. In some implementations, the system 100 can use the second model 116 to detect sentiment of the user of the building model generator application 120 and update the second model 116 according to the detected sentiment, such as to improve the experience provided by the virtual assistant application 120.

In some implementations, the applications 120 include at least one BMS format integrator application 120. The BMS format integrator application can provide various services to support integration of building equipment into the BMS of the building, such as presenting information from equipment operational parameter requests and/or equipment control, receiving queries regarding actions to perform to establish, update, and/or control equipment, and presenting responses indicating actions to perform to integrate the building equipment into the BMS of the building. The BMS format integrator application can receive information regarding an equipment model for a piece of building equipment recently installed in the building, such as model identifiers, text descriptions, predetermined setpoints, or camera images, and process the received information using the second model 116 to generate corresponding responses.

Feedback Training

Referring further to FIG. 1, the system 100 can include at least one feedback trainer 128 coupled with at least one feedback repository 124. The system 100 can use the feedback trainer 128 to increase the precision and/or accuracy of the outputs generated by the second model(s) 116 according to feedback provided by users of the system 100 and/or the applications 120.

The feedback repository 124 can include feedback received from users regarding output presented by the applications 120. For example, for at least a subset of outputs presented by the applications 120, the applications 120 can present one or more user input elements for receiving feedback regarding the outputs. The user input elements can include, for example, indications of binary feedback regarding the outputs (e.g., good/bad feedback; feedback indicating the outputs do or do not meet the user's criteria, such as criteria regarding technical accuracy or precision); indications of multiple levels of feedback (e.g., scoring the outputs on a predetermined scale, such as a 1-5 scale or 1-10 scale); freeform feedback (e.g., text or audio feedback); or various combinations thereof.

The system 100 can store and/or maintain feedback in the feedback repository 124. In some implementations, the system 100 stores the feedback with one or more data elements associated with the feedback, including but not limited to the outputs for which the feedback was received, the second model(s) 116 used to generate the outputs, and/or input information used by the second model(s) 116 to generate the outputs (e.g., service request information; information captured by the user regarding the item of equipment).

The feedback trainer 128 can update the one or more second models 116 using the feedback. The feedback trainer 128 can be similar to the model updater 108. In some implementations, the feedback trainer 128 is implemented by the model updater 108; for example, the model updater 108 can include or be coupled with the feedback trainer 128. The feedback trainer 128 can perform various configuration operations (e.g., retraining, fine-tuning, transfer learning, etc.) on the second model(s) 116 using the feedback from the feedback repository 124. In some implementations, the feedback trainer 128 identifies one or more first parameters of the second model 116 to maintain as having predetermined values (e.g., freeze the weights and/or biases of one or more first layers of the second model 116), and performs a training process, such as a fine tuning process, to configure parameters of one or more second parameters of the second model 116 using the feedback (e.g., one or more second layers of the second model 116, such as output layers or output heads of the second model 116).

In some implementations, the system 100 may not include and/or use the model updater 108 (or the feedback trainer 128) to determine the second model(s) 116. For example, the system 100 can include or be coupled with an output processor (e.g., an output processor similar or identical to accuracy checker 316 described with reference to FIG. 3) that can evaluate and/or modify outputs from the first model 104 prior to operation of applications 120, including to perform any of various post-processing operations on the output from the first model 104. For example, the output processor can compare outputs of the first model 104 with data from data sources 112 to validate the outputs of the first model 104 and/or modify the outputs of the first model 104 (or output an error) responsive to the outputs not satisfying a validation condition.

Connected Machine Learning Models

Referring further to FIG. 1, the second model 116 can be coupled with one or more third models, functions, or algorithms for training/configuration and/or runtime operations. The third models can include, for example and without limitation, any of various models relating to items of equipment, such as energy usage models, sustainability models, carbon models, air quality models, or occupant comfort models. For example, the second model 116 can be used to process unstructured information regarding items of equipment into predefined template formats compatible with various third models, such that outputs of the second model 116 can be provided as inputs to the third models; this can allow more accurate training of the third models, more training data to be generated for the third models, and/or more data available for use by the third models. The second model 116 can receive inputs from one or more third models, which can provide greater data to the second model 116 for processing.

Automated Service Scheduling and Provisioning

The system 100 can be used to automate operations for scheduling, provisioning, and deploying service technicians and resources for service technicians to perform service operations. For example, the system 100 can use at least one of the first model 104 or the second model 116 to determine, based on processing information regarding service operations for items of equipment relative to completion criteria for the service operation, particular characteristics of service operations such as experience parameters of scheduled service technicians, identifiers of parts provided for the service operations, geographical data, types of customers, types of problems, or information content provided to the service technicians to facilitate the service operation, where such characteristics correspond to the completion criteria being satisfied (e.g., where such characteristics correspond to an increase in likelihood of the completion criteria being satisfied relative to other characteristics for service technicians, parts, information content, etc.). For example, the system 100 can determine, for a given item of equipment, particular parts to include on a truck to be sent to the site of the item of equipment. As such, the system 100, responsive to processing inputs at runtime such as service requests, can automatically and more accurately identify service technicians and parts to direct to the item of equipment for the service operations. The system 100 can use timing information to perform batch scheduling for multiple service operations and/or multiple technicians for the same or multiple service operations. The system 100 can perform batch scheduling for multiple trucks for multiple items of equipment, such as to schedule a first one or more parts having a greater likelihood for satisfying the completion criteria for a first item of equipment on a first truck, and a second one or more parts having a greater likelihood for satisfying the completion criteria for a second item of equipment on a second truck.

Figure 2:
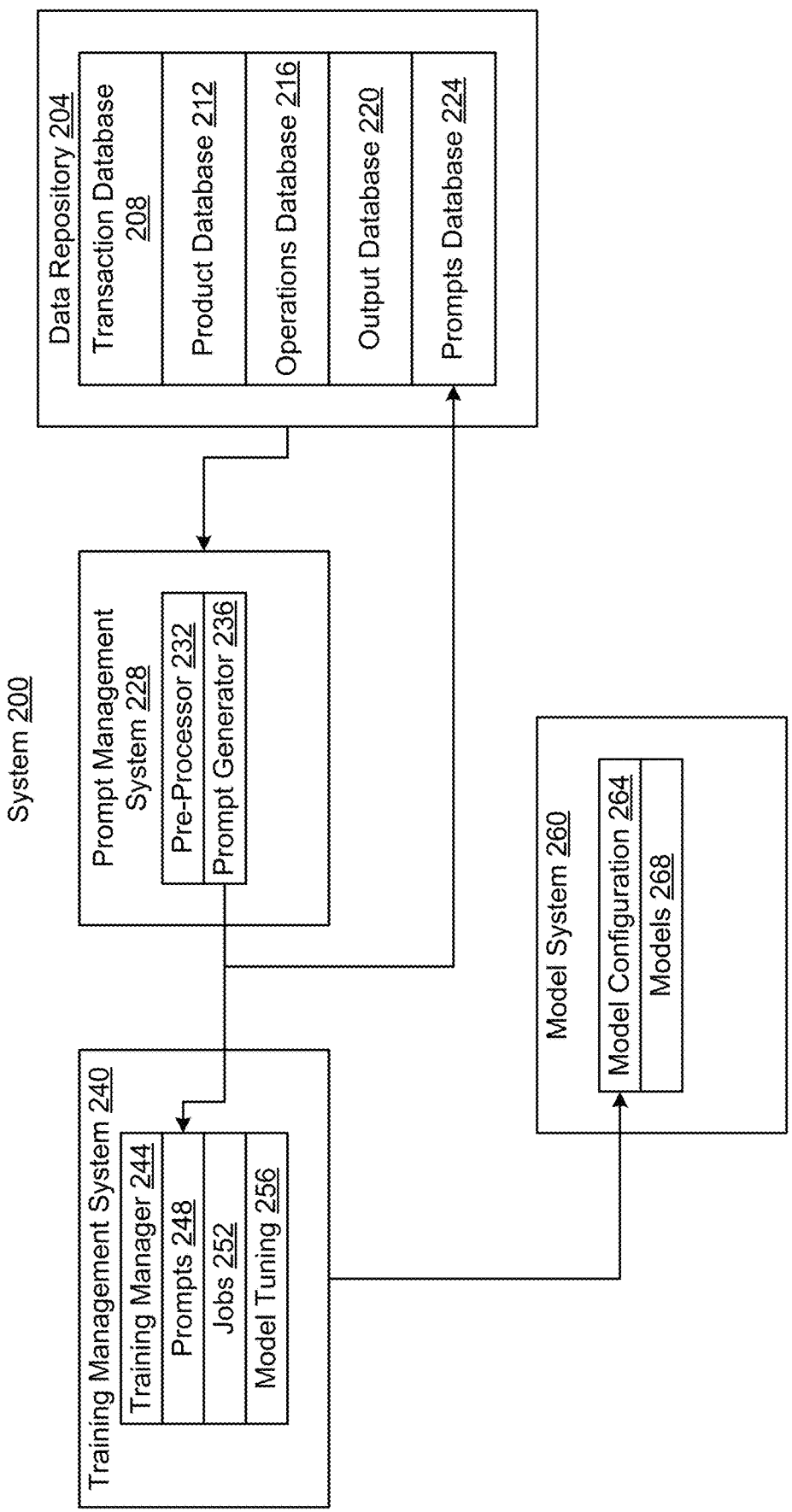
FIG. 2 is a block diagram of an example of a language model-based system for equipment servicing applications.

System Architectures for Generative AI Applications for Building Management System and Equipment Modeling FIG. 2 depicts an example of a system 200. The system 200 can include one or more components or features of the system 100, such as any one or more of the first model 104, data sources 112, second model 116, applications 120, feedback repository 124, and/or feedback trainer 128. The system 200 can perform specific operations to enable generative AI applications for building managements systems and equipment servicing, such as various manners of processing input data into training data (e.g., tokenizing input data; forming input data into prompts and/or completions), and managing training and other machine learning model configuration processes. Various components of the system 200 can be implemented using one or more computer systems, which may be provided on the same or different processors (e.g., processors communicatively coupled via wired and/or wireless connections).

The system 200 can include at least one data repository 204, which can be similar to the data sources 112 described with reference to FIG. 1. For example, the data repository 204 can include a transaction database 208, which can be similar or identical to one or more of warranty data or service data of data sources 112. For example, the transaction database 208 can include data such as parts used for service transactions; sales data indicating various service transactions or other transactions regarding items of equipment; warranty and/or claims data regarding items of equipment; and service data.

The data repository 204 can include a product database 212, which can be similar or identical to the parts data of the data sources 112. The product database 212 can include, for example, data regarding products available from various vendors, specifications or parameters regarding products, and indications of products used for various service operations. The product database 212 can include data such as events or alarms associated with products; logs of product operation; and/or time series data regarding product operation, such as longitudinal data values of operation of products and/or building equipment.

The data repository 204 can include an operations database 216, which can be similar or identical to the operations data of the data sources 112. For example, the operations database 216 can include data such as manuals regarding parts, products, and/or items of equipment; customer service data; and or reports, such as operation or service logs.

In some implementations, the data repository 204 can include an output database 220, which can include data of outputs that may be generated by various machine learning models and/or algorithms. For example, the output database 220 can include values of pre-calculated predictions and/or insights, such as parameters regarding operation items of equipment, such as setpoints, changes in setpoints, flow rates, control schemes, identifications of error conditions, or various combinations thereof.

As depicted in FIG. 2, the system 200 can include a prompt management system 228. The prompt management system 228 can include one or more rules, heuristics, logic, policies, algorithms, functions, machine learning models, neural networks, scripts, or various combinations thereof to perform operations including processing data from data repository 204 into training data for configuring various machine learning models. For example, the prompt management system 228 can retrieve and/or receive data from the data repository 204 and determine training data elements that include examples of input and outputs for generation by machine learning models, such as a training data element that includes a prompt and a completion corresponding to the prompt, based on the data from the data repository 204.

In some implementations, the prompt management system 228 includes a pre-processor 232. The pre-processor 232 can perform various operations to prepare the data from the data repository 204 for prompt generation. For example, the pre-processor 232 can perform any of various filtering, compression, tokenizing, or combining (e.g., combining data from various databases of the data repository 204) operations.

The prompt management system 228 can include a prompt generator 236. The prompt generator 236 can generate, from data of the data repository 204, one or more training data elements that include a prompt and a completion corresponding to the prompt. In some implementations, the prompt generator 236 receives user input indicative of prompt and completion portions of data. For example, the user input can indicate template portions representing prompts of structured data, such as predefined fields or forms of documents, and corresponding completions provided for the documents. The user input can assign prompts to unstructured data. In some implementations, the prompt generator 236 automatically determines prompts and completions from data of the data repository 204, such as by using any of various natural language processing algorithms to detect prompts and completions from data. In some implementations, the system 200 does not identify distinct prompts and completions from data of the data repository 204.

Referring further to FIG. 2, the system 200 can include a training management system 240. The training management system 240 can include one or more rules, heuristics, logic, policies, algorithms, functions, machine learning models, neural networks, scripts, or various combinations thereof to perform operations including controlling training of machine learning models, including performing fine tuning and/or transfer learning operations.

The training management system 240 can include a training manager 244. The training manager 244 can incorporate features of at least one of the model updater 108 or the feedback trainer 128 described with reference to FIG. 1. For example, the training manager 244 can provide training data including a plurality of training data elements (e.g., prompts and corresponding completions) to the model system 260 as described further herein to facilitate training machine learning models.

In some implementations, the training management system 240 includes a prompts database 224. For example, the training management system 240 can store one or more training data elements from the prompt management system 228, such as to facilitate asynchronous and/or batched training processes.

The training manager 244 can control the training of machine learning models using information or instructions maintained in a model tuning database 256. For example, the training manager 244 can store, in the model tuning database 256, various parameters or hyperparameters for models and/or model training.

In some implementations, the training manager 244 stores a record of training operations in a jobs database 252. For example, the training manager 244 can maintain data such as a queue of training jobs, parameters or hyperparameters to be used for training jobs, or information regarding performance of training.

Referring further to FIG. 2, the system 200 can include at least one model system 260 (e.g., one or more language model systems). The model system 260 can include one or more rules, heuristics, logic, policies, algorithms, functions, machine learning models, neural networks, scripts, or various combinations thereof to perform operations including configuring one or more machine learning models 268 based on instructions from the training management system 240. In some implementations, the training management system 240 implements the model system 260. In some implementations, the training management system 240 can access the model system 260 using one or more APIs, such as to provide training data and/or instructions for configuring machine learning models 268 via the one or more APIs. The model system 260 can operate as a service layer for configuring the machine learning models 268 responsive to instructions from the training management system 240. The machine learning models 268 can be or include the first model 104 and/or second model 116 described with reference to FIG. 1.

The model system 260 can include a model configuration processor 264. The model configuration processor 264 can incorporate features of the model updater 108 and/or the feedback trainer 128 described with reference to FIG. 1. For example, the model configuration processor 264 can apply training data (e.g., prompts 248 and corresponding completions) to the machine learning models 268 to configure (e.g., train, modify, update, fine-tune, etc.) the machine learning models 268. The training manager 244 can control training by the model configuration processor 264 based on model tuning parameters in the model tuning database 256, such as to control various hyperparameters for training. In various implementations, the system 200 can use the training management system 240 to configure the machine learning models 268 in a similar manner as described with reference to the second model 116 of FIG. 1, such as to train the machine learning models 268 using any of various data or combinations of data from the data repository 204.

Application Session Management

Figure 3:
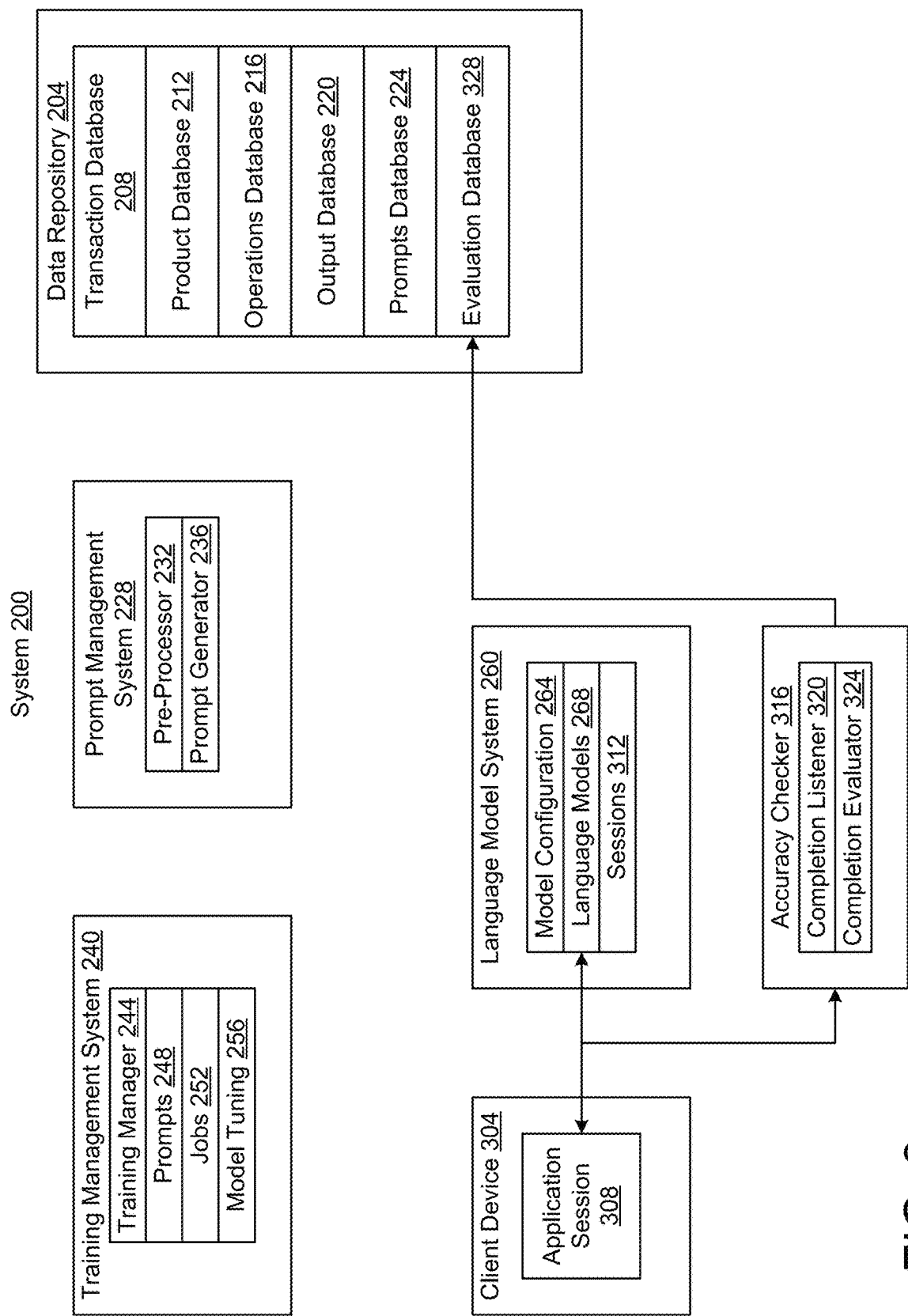
FIG. 3 is a block diagram of an example of the system of FIG. 2 including user application session components.

FIG. 3 depicts an example of the system 200, in which the system 200 can perform operations to implement at least one application session 308 for a client device 304. For example, responsive to configuring the machine learning models 268, the system 200 can generate data for presentation by the client device 304 (including generating data responsive to information received from the client device 304) using the at least one application session 308 and the one or more machine learning models 268.

The client device 304 can be a device of a user, such as a technician or building manager. The client device 304 can include any of various wireless or wired communication interfaces to communicate data with the model system 260, such as to provide requests to the model system 260 indicative of data for the machine learning models 268 to generate, and to receive outputs from the model system 260. The client device 304 can include various user input and output devices to facilitate receiving and presenting inputs and outputs.

In some implementations, the system 200 provides data to the client device 304 for the client device 304 to operate the at least one application session 308. The application session 308 can include a session corresponding to any of the applications 120 described with reference to FIG. 1. For example, the client device 304 can launch the application session 308 and provide an interface to request one or more prompts. Responsive to receiving the one or more prompts, the application session 308 can provide the one or more prompts as input to the machine learning model 268. The machine learning model 268 can process the input to generate a completion, and provide the completion to the application session 308 to present via the client device 304. In some implementations, the application session 308 can iteratively generate completions using the machine learning models 268. For example, the machine learning models 268 can receive a first prompt from the application session 308, determine a first completion based on the first prompt and provide the first completion to the application session 308, receive a second prompt from the application session 308, determine a second completion based on the second prompt (which may include at least one of the first prompt or the first completion concatenated to the second prompt), and provide the second completion to the application session 308.

In some implementations, the model system 260 includes at least one sessions database 312. The sessions database 312 can maintain records of application session 308 implemented by client devices 304. For example, the sessions database 312 can include records of prompts provided to the machine learning models 268 and completions generated by the machine learning models 268. As described further with reference to FIG. 4, the system 200 can use the data in the sessions database 312 to fine-tune or otherwise update the machine learning models 268.

Completion Checking

In some implementations, the system 200 includes an accuracy checker 316. The accuracy checker 316 can include one or more rules, heuristics, logic, policies, algorithms, functions, machine learning models, neural networks, scripts, or various combinations thereof to perform operations including evaluating performance criteria regarding the completions determined by the model system 260. For example, the accuracy checker 316 can include at least one completion listener 320. The completion listener 320 can receive the completions determined by the model system 260 (e.g., responsive to the completions being generated by the machine learning model 268 and/or by retrieving the completions from the sessions database 312).

The accuracy checker 316 can include at least one completion evaluator 324. The completion evaluator 324 can evaluate the completions (e.g., as received or retrieved by the completion listener 320) according to various criteria. In some implementations, the completion evaluator 324 evaluates the completions by comparing the completions with corresponding data from the data repository 204. For example, the completion evaluator 324 can identify data of the data repository 204 having similar text as the prompts and/or completions (e.g., using any of various natural language processing algorithms), and determine whether the data of the completions is within a range of expected data represented by the data of the data repository 204.

In some implementations, the accuracy checker 316 can store an output from evaluating the completion (e.g., an indication of whether the completion satisfies the criteria) in an evaluation database 328. For example, the accuracy checker 316 can assign the output (which may indicate at least one of a binary indication of whether the completion satisfied the criteria or an indication of a portion of the completion that did not satisfy the criteria) to the completion for storage in the evaluation database 328, which can facilitate further training of the machine learning models 268 using the completions and output.

Feedback Training

Figure 4:
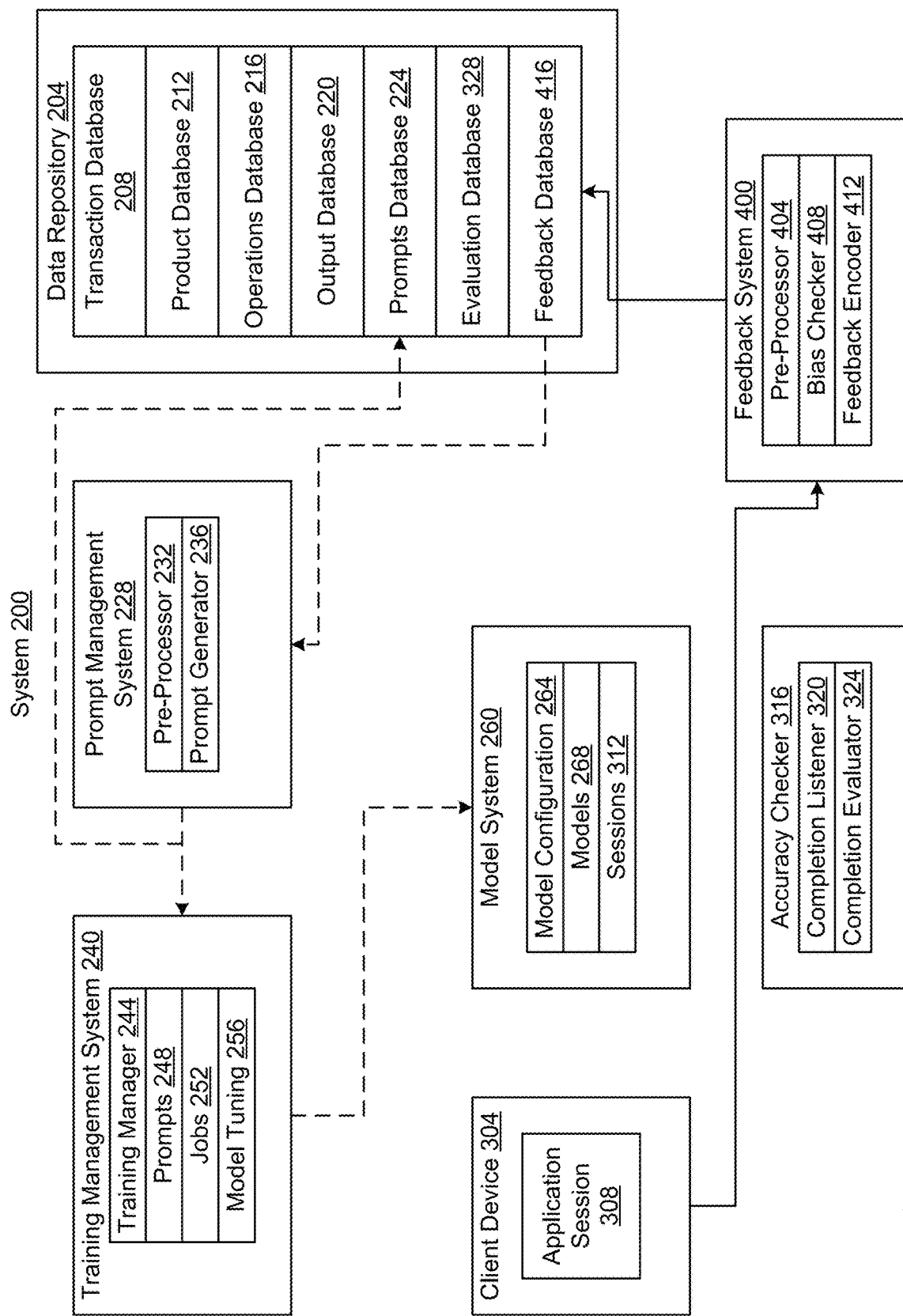
FIG. 4 is a block diagram of an example of the system of FIG. 2 including feedback training components.

FIG. 4 depicts an example of the system 200 that includes a feedback system 400, such as a feedback aggregator. The feedback system 400 can include one or more rules, heuristics, logic, policies, algorithms, functions, machine learning models, neural networks, scripts, or various combinations thereof to perform operations including preparing data for updating and/or updating the machine learning models 268 using feedback corresponding to the application sessions 308, such as feedback received as user input associated with outputs presented by the application sessions 308. The feedback system 400 can incorporate features of the feedback repository 124 and/or feedback trainer 128 described with reference to FIG. 1.

The feedback system 400 can receive feedback (e.g., from the client device 304) in various formats. For example, the feedback can include any of text, speech, audio, image, and/or video data. The feedback can be associated (e.g., in a data structure generated by the application session 308) with the outputs of the machine learning models 268 for which the feedback is provided. The feedback can be received or extracted from various forms of data, including external data sources such as manuals, service reports, or Wikipedia-type documentation.

In some implementations, the feedback system 400 includes a pre-processor 404. The pre-processor 404 can perform any of various operations to modify the feedback for further processing. For example, the pre-processor 404 can incorporate features of, or be implemented by, the pre-processor 232, such as to perform operations including filtering, compression, tokenizing, or translation operations (e.g., translation into a common language of the data of the data repository 204).

The feedback system 400 can include a bias checker 408. The bias checker 408 can evaluate the feedback using various bias criteria, and control inclusion of the feedback in a feedback database 416 (e.g., a feedback database 416 of the data repository 204 as depicted in FIG. 4) according to the evaluation. The bias criteria can include, for example and without limitation, criteria regarding qualitative and/or quantitative differences between a range or statistic measure of the feedback relative to actual, expected, or validated values.

The feedback system 400 can include a feedback encoder 412. The feedback encoder 412 can process the feedback (e.g., responsive to bias checking by the bias checker 408) for inclusion in the feedback database 416. For example, the feedback encoder 412 can encode the feedback as values corresponding to outputs scoring determined by the model system 260 while generating completions (e.g., where the feedback indicates that the completion presented via the application session 308 was acceptable, the feedback encoder 412 can encode the feedback by associating the feedback with the completion and assigning a relatively high score to the completion).

As indicated by the dashed arrows in FIG. 4, the feedback can be used by the prompt management system 228 and training management system 240 to further update one or more machine learning models 268. For example, the prompt management system 228 can retrieve at least one feedback (and corresponding prompt and completion data) from the feedback database 416, and process the at least one feedback to determine a feedback prompt and feedback completion to provide to the training management system 240 (e.g., using pre-processor 232 and/or prompt generator 236, and assigning a score corresponding to the feedback to the feedback completion). The training manager 244 can provide instructions to the model system 260 to update the machine learning models 268 using the feedback prompt and the feedback completion, such as to perform a fine-tuning process using the feedback prompt and the feedback completion. In some implementations, the training management system 240 performs a batch process of feedback-based fine tuning by using the prompt management system 228 to generate a plurality of feedback prompts and a plurality of feedback completion, and providing instructions to the model system 260 to perform the fine-tuning process using the plurality of feedback prompts and the plurality of feedback completions.

Data Filtering and Validation Systems

Figure 5:
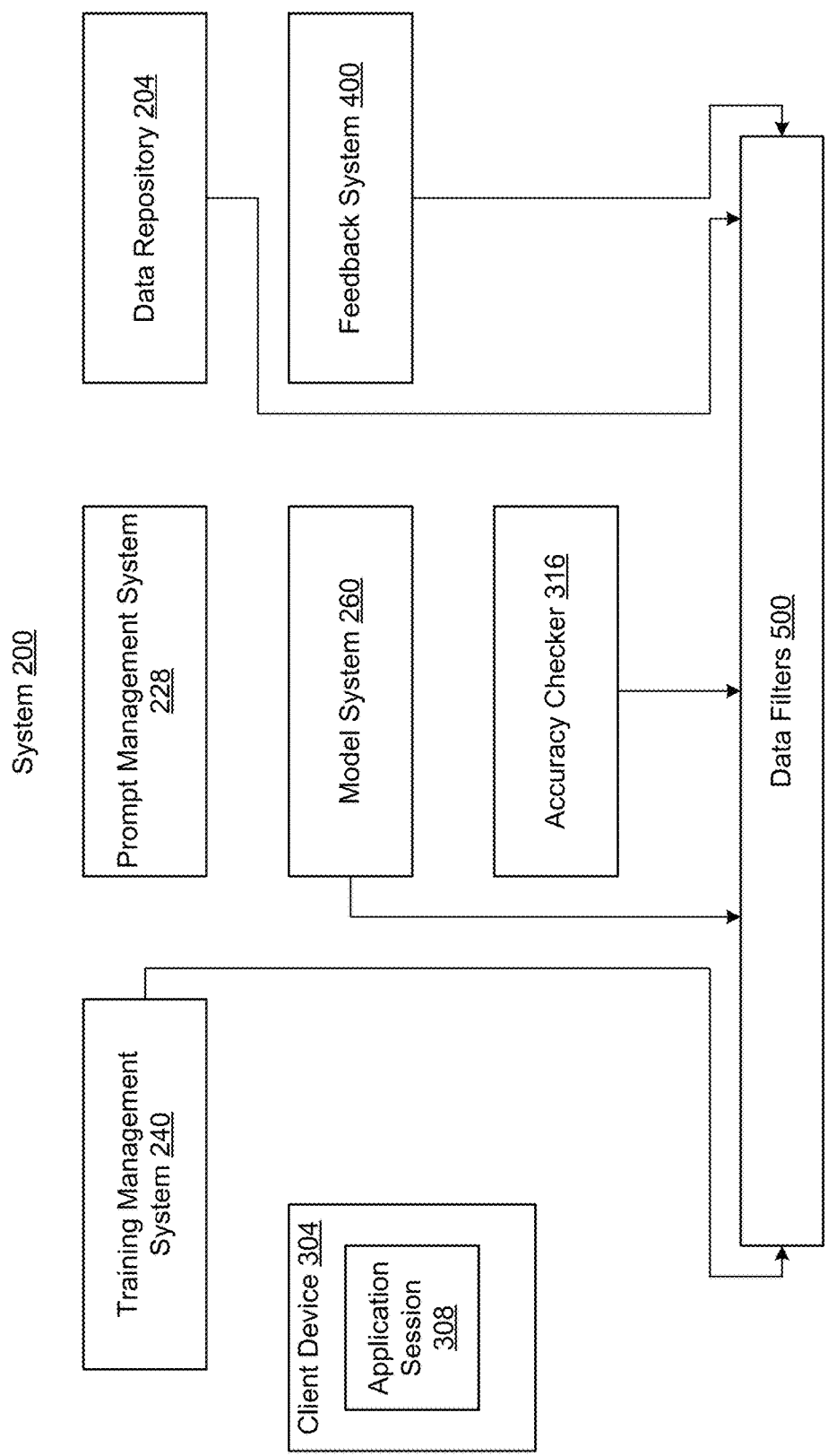
FIG. 5 is a block diagram of an example of the system of FIG. 2 including data filters.

FIG. 5 depicts an example of the system 200, where the system 200 can include one or more data filters 500 (e.g., data validators). The data filters 500 can include any one or more rules, heuristics, logic, policies, algorithms, functions, machine learning models, neural networks, scripts, or various combinations thereof to perform operations including modifying data processed by the system 200 and/or triggering alerts responsive to the data not satisfying corresponding criteria, such as thresholds for values of data. Various data filtering processes described with reference to FIG. 5 (as well as FIGS. 6 and 7) can enable the system 200 to implement timely operations for improving the precision and/or accuracy of completions or other information generated by the system 200 (e.g., including improving the accuracy of feedback data used for fine-tuning the machine learning models 268). The data filters 500 can allow for interactions between various algorithms, models, and computational processes.

For example, the data filters 500 can be used to evaluate data relative to thresholds relating to data including, for example and without limitation, acceptable data ranges, setpoints, temperatures, pressures, flow rates (e.g., mass flow rates), or vibration rates for an item of equipment. The threshold can include any of various thresholds, such as one or more of minimum, maximum, absolute, relative, fixed band, and/or floating band thresholds.

The data filters 500 can enable the system 200 to detect when data, such as prompts, completions, or other inputs and/or outputs of the system 200, collide with thresholds that represent realistic behavior or operation or other limits of items of equipment. For example, the thresholds of the data filters 500 can correspond to values of data that are within feasible or recommended operating ranges. In some implementations, the system 200 determines or receives the thresholds using models or simulations of items of equipment, such as plant or equipment simulators, chiller models, HVAC-R models, refrigeration cycle models, etc. The system 200 can receive the thresholds as user input (e.g., from experts, technicians, or other users). The thresholds of the data filters 500 can be based on information from various data sources. The thresholds can include, for example and without limitation, thresholds based on information such as equipment limitations, safety margins, physics, expert teaching, etc. For example, the data filters 500 can include thresholds determined from various models, functions, or data structures (e.g., tables) representing physical properties and processes, such as physics of psychometrics, thermodynamics, and/or fluid dynamics information.

The system 200 can determine the thresholds using the feedback system 400 and/or the client device 304, such as by providing a request for feedback that includes a request for a corresponding threshold associated with the completion and/or prompt presented by the application session 308. For example, the system 200 can use the feedback to identify realistic thresholds, such as by using feedback regarding data generated by the machine learning models 268 for ranges, setpoints, and/or start-up or operating sequences regarding items of equipment (and which can thus be validated by human experts). In some implementations, the system 200 selectively requests feedback indicative of thresholds based on an identifier of a user of the application session 308, such as to selectively request feedback from users having predetermined levels of expertise and/or assign weights to feedback according to criteria such as levels of expertise.

In some implementations, one or more data filters 500 correspond to a given setup. For example, the setup can represent a configuration of a corresponding item of equipment (e.g., configuration of a chiller, etc.). The data filters 500 can represent various thresholds or conditions with respect to values for the configuration, such as feasible or recommendation operating ranges for the values. In some implementations, one or more data filters 500 correspond to a given situation. For example, the situation can represent at least one of an operating mode or a condition of a corresponding item of equipment.

FIG. 5 depicts some examples of data (e.g., inputs, outputs, and/or data communicated between nodes of machine learning models 268) to which the data filters 500 can be applied to evaluate data processed by the system 200 including various inputs and outputs of the system 200 and components thereof. This can include, for example and without limitation, filtering data such as data communicated between one or more of the data repository 204, prompt management system 228, training management system 240, model system 260, client device 304, accuracy checker 316, and/or feedback system 400. For example, the data filters 500 (as well as validation system 600 described with reference to FIG. 6 and/or expert filter collision system 700 described with reference to FIG. 7) can receive data outputted from a source (e.g., source component) of the system 200 for receipt by a destination (e.g., destination component) of the system 200, and filter, modify, or otherwise process the outputted data prior to the system 200 providing the outputted data to the destination. The sources and destinations can include any of various combinations of components and systems of the system 200.

The system 200 can perform various actions responsive to the processing of data by the data filters 500. In some implementations, the system 200 can pass data to a destination without modifying the data (e.g., retaining a value of the data prior to evaluation by the data filter 500) responsive to the data satisfying the criteria of the respective data filter(s) 500. In some implementations, the system 200 can at least one of (i) modify the data or (ii) output an alert responsive to the data not satisfying the criteria of the respective data filter(s) 500. For example, the system 200 can modify the data by modifying one or more values of the data to be within the criteria of the data filters 500.

In some implementations, the system 200 modifies the data by causing the machine learning models 268 to regenerate the completion corresponding to the data (e.g., for up to a predetermined threshold number of regeneration attempts before triggering the alert). This can enable the data filters 500 and the system 200 selectively trigger alerts responsive to determining that the data (e.g., the collision between the data and the thresholds of the data filters 500) may not be repairable by the machine learning model 268 aspects of the system 200.

The system 200 can output the alert to the client device 304. The system 200 can assign a flag corresponding to the alert to at least one of the prompt (e.g., in prompts database 224) or the completion having the data that triggered the alert.

Figure 6:
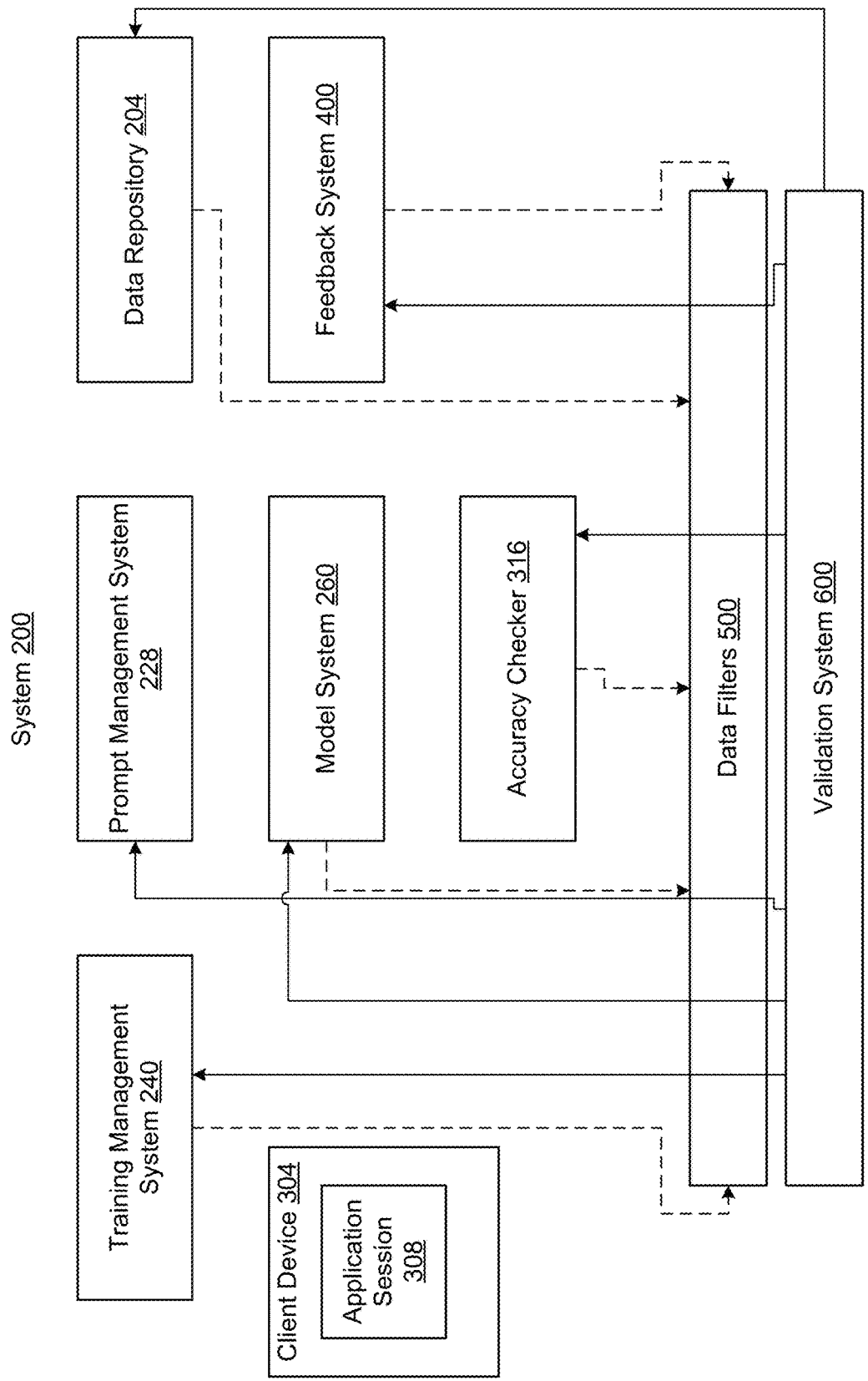
FIG. 6 is a block diagram of an example of the system of FIG. 2 including data validation components.

FIG. 6 depicts an example of the system 200, in which a validation system 600 is coupled with one or more components of the system 200, such as to process and/or modify data communicated between the components of the system 200. For example, the validation system 600 can provide a validation interface for human users (e.g., expert supervisors, checkers) and/or expert systems (e.g., data validation systems that can implement processes analogous to those described with reference to the data filters 500) to receive data of the system 200 and modify, validate, or otherwise process the data. For example, the validation system 600 can provide to human expert supervisors, human checkers, and/or expert systems various data of the system 200, receive responses to the provided data indicating requested modifications to the data or validations of the data, and modify (or validate) the provided data according to the responses.

For example, the validation system 600 can receive data such as data retrieved from the data repository 204, prompts outputted by the prompt management system 228, completions outputted by the model system 260, indications of accuracy outputted by the accuracy checker 316, etc., and provide the received data to at least one of an expert system or a user interface. In some implementations, the validation system 600 receives a given item of data prior to the given item of data being processed by the model system 260, such as to validate inputs to the machine learning models 268 prior to the inputs being processed by the machine learning models 268 to generate outputs, such as completions.

In some implementations, the validation system 600 validates data by at least one of (i) assigning a label (e.g., a flag, etc.) to the data indicating that the data is validated or (ii) passing the data to a destination without modifying the data. For example, responsive to receiving at least one of a user input (e.g., from a human validator/supervisor/expert) that the data is valid or an indication from an expert system that the data is valid, the validation system 600 can assign the label and/or provide the data to the destination.

The validation system 600 can selectively provide data from the system 200 to the validation interface responsive to operation of the data filters 500. This can enable the validation system 600 to trigger validation of the data responsive to collision of the data with the criteria of the data filters 500. For example, responsive to the data filters 500 determining that an item of data does not satisfy a corresponding criteria, the data filters 500 can provide the item of data to the validation system 600. The data filters 500 can assign various labels to the item of data, such as indications of the values of the thresholds that the data filters 500 used to determine that the item of data did not satisfy the thresholds. Responsive to receiving the item of data from the data filters 500, the validation system 600 can provide the item of data to the validation interface (e.g., to a user interface of client device 304 and/or application session 308; for comparison with a model, simulation, algorithm, or other operation of an expert system) for validation. In some implementations, the validation system 600 can receive an indication that the item of data is valid (e.g., even if the item of data did not satisfy the criteria of the data filters 500) and can provide the indication to the data filters 500 to cause the data filters 500 to at least partially modify the respective thresholds according to the indication.

In some implementations, the validation system 600 selectively retrieves data for validation where (i) the data is determined or outputted prior to use by the machine learning models 268, such as data from the data repository 204 or the prompt management system 228, or (ii) the data does not satisfy a respective data filter 500 that processes the data. This can enable the system 200, the data filters 500, and the validation system 600 to update the machine learning models 268 and other machine learning aspects (e.g., generative AI aspects) of the system 200 to more accurately generate data and completions (e.g., enabling the data filters 500 to generate alerts that are received by the human experts/expert systems that may be repairable by adjustments to one or more components of the system 200).

Figure 7:
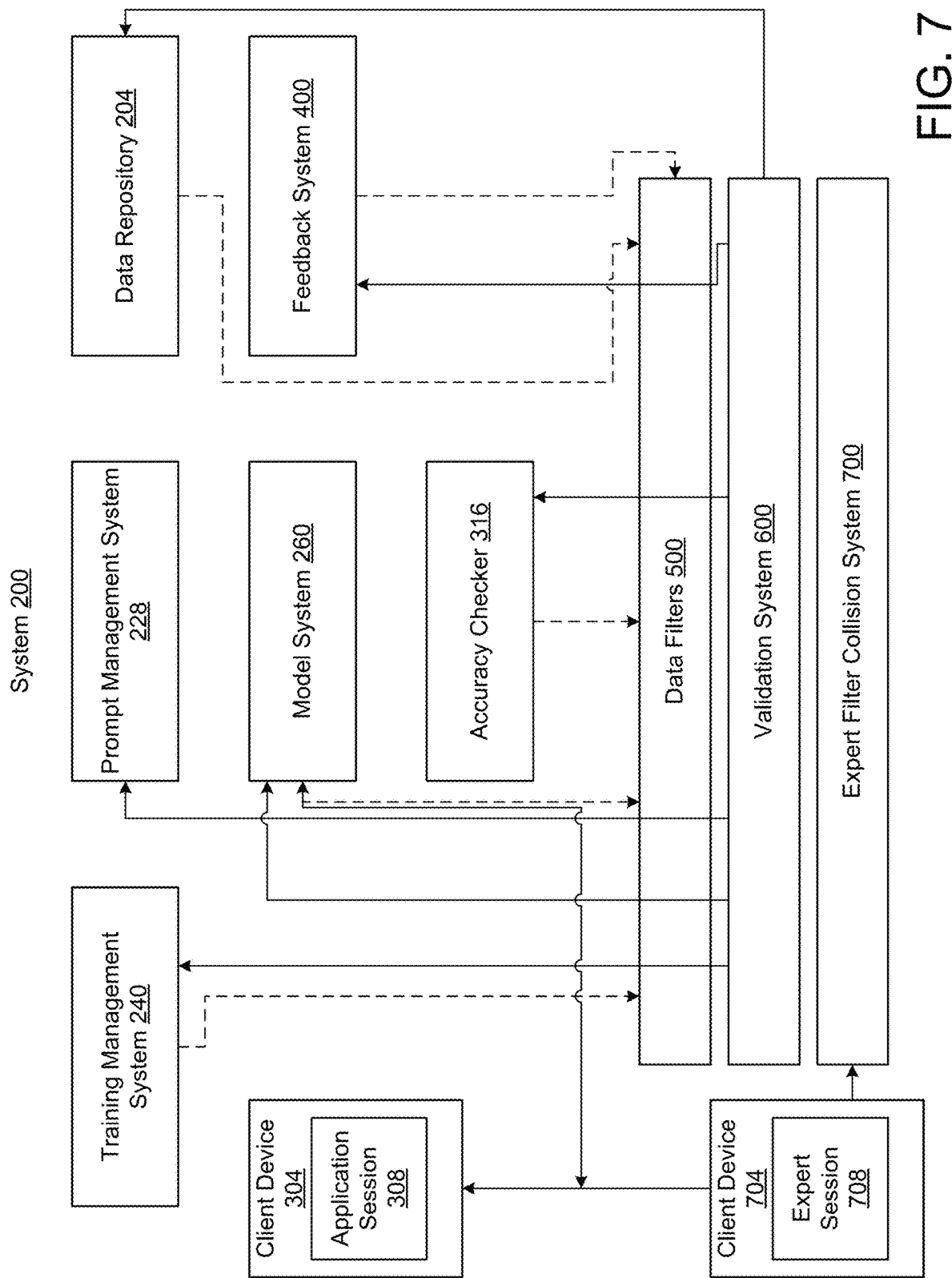
FIG. 7 is a block diagram of an example of the system of FIG. 2 including expert review and intervention components.

FIG. 7 depicts an example of the system 200, in which an expert filter collision system 700 ("expert system" 700) can facilitate providing feedback and providing more accurate and/or precise data and completions to a user via the application session 308. For example, the expert system 700 can interface with various points and/or data flows of the system 200, as depicted in FIG. 7, where the system 200 can provide data to the expert filter collision system 700, such as to transmit the data to a user interface and/or present the data via a user interface of the expert filter collision system 700 that can accessed via an expert session 708 of a client device 704. For example, via the expert session 708, the expert system 700 can enable functions such as receiving inputs for a human expert to provide feedback to a user of the client device 304; a human expert to guide the user through the data (e.g., completions) provided to the client device 304, such as reports, insights, and action items; a human expert to review and/or provide feedback for revising insights, guidance, and recommendations before being presented by the application session 308; a human expert to adjust and/or validate insights or recommendations before they are viewed or used for actions by the user; or various combinations thereof. In some implementations, the expert system 700 can use feedback received via the expert session as inputs to update the machine learning models 268 (e.g., to perform fine-tuning).

In some implementations, the expert system 700 retrieves data to be provided to the application session 308, such as completions generated by the machine learning models 268. The expert system 700 can present the data via the expert session 708, such as to request feedback regarding the data from the client device 704. For example, the expert system 700 can receive feedback regarding the data for modifying or validating the data (e.g., editing or validating completions). In some implementations, the expert system 700 requests at least one of an identifier or a credential of a user of the client device 704 prior to providing the data to the client device 704 and/or requesting feedback regarding the data from the expert session 708. For example, the expert system 700 can request the feedback responsive to determining that the at least one of the identifier or the credential satisfies a target value for the data. This can allow the expert system 700 to selectively identify experts to use for monitoring and validating the data.

In some implementations, the expert system 700 facilitates a communication session regarding the data, between the application session 308 and the expert session 708. For example, the expert system 700, responsive to detecting presentation of the data via the application session 308, can request feedback regarding the data (e.g., user input via the application session 308 for feedback regarding the data), and provide the feedback to the client device 704 to present via the expert session 708. The expert session 708 can receive expert feedback regarding at least one of the data or the feedback from the user to provide to the application session 308. In some implementations, the expert system 700 can facilitate any of various real-time or asynchronous messaging protocols between the application session 308 and expert session 708 regarding the data, such as any of text, speech, audio, image, and/or video communications or combinations thereof. This can allow the expert system 700 to provide a platform for a user receiving the data (e.g., customer or field technician) to receive expert feedback from a user of the client device 704 (e.g., expert technician). In some implementations, the expert system 700 stores a record of one or more messages or other communications between the application session 308 and the expert session 708 in the data repository 204 to facilitate further configuration of the machine learning models 268 based on the interactions between the users of the application session 308 and the expert session 708.

Building Data Platforms and Digital Twin Architectures

Referring further to FIGS. 1-7, various systems and methods described herein can be executed by and/or communicate with building data platforms, including data platforms of building management systems. For example, the data repository 204 can include or be coupled with one or more building data platforms, such as to ingest data from building data platforms and/or digital twins. The client device 304 can communicate with the system 200 via the building data platform, and can feedback, reports, and other data to the building data platform. In some implementations, the data repository 204 maintains building data platform-specific databases, such as to enable the system 200 to configure the machine learning models 268 on a building data platform-specific basis (or on an entity-specific basis using data from one or more building data platforms maintained by the entity).

For example, in some implementations, various data discussed herein may be stored in, retrieved from, or processed in the context of building data platforms and/or digital twins; processed at (e.g., processed using models executed at) a cloud or other off-premises computing system/device or group of systems/devices, an edge or other on-premises system/device or group of systems/devices, or a hybrid thereof in which some processing occurs off-premises and some occurs on-premises; and/or implemented using one or more gateways for communication and data management amongst various such systems/devices. In some such implementations, the building data platforms and/or digital twins may be provided within an infrastructure such as those described in U.S. patent application Ser. No. 17/134,661 filed Dec. 28, 2020, Ser. No. 18/080,360, filed Dec. 13, 2022, Ser. No. 17/537,046 filed Nov. 29, 2021, and Ser. No. 18/096,965, filed Jan. 13, 2023, and Indian Patent Application No. 202341008712, filed Feb. 10, 2023, the disclosures of which are incorporated herein by reference in their entireties.

Generative AI-Based Systems and Methods for Equipment Modeling

As described above, systems and methods in accordance with the present disclosure can use machine learning models, including LLMs and other generative AI models, to ingest data regarding building management systems and equipment in various unstructured and structured formats, and generate completions and other outputs targeted to provide useful information to users. Various systems and methods described herein can use machine learning models to support applications for presenting data with high accuracy and relevance.

Figure 8:
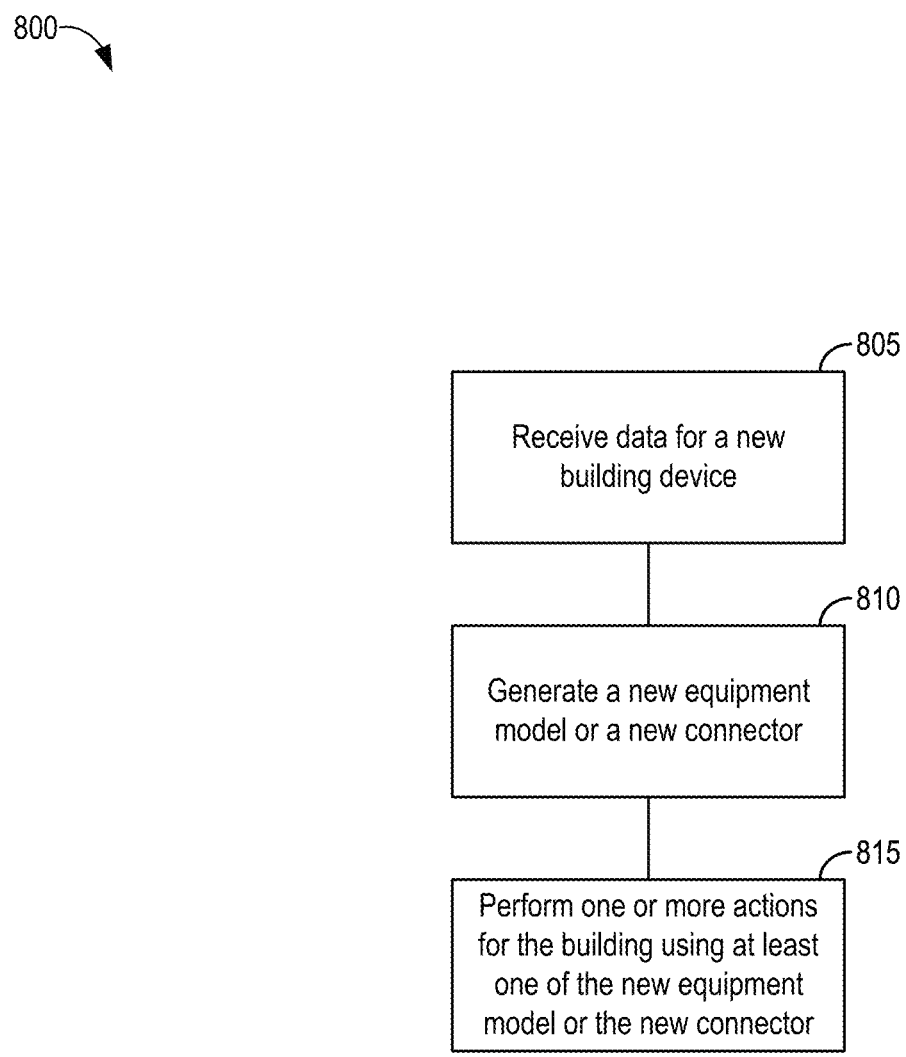
FIG. 8 is a flow diagram of a process of implementing equipment models for pieces of building equipment.

Equipment Modeling Management Responsive to Detection of Building Equipment Using Machine Learning Models FIG. 8 depicts an example of a process 800. The process 800 can be performed using various devices and/or systems described herein, including by not limited to the system 100, the system 200, and/or one or more components thereof. Various aspects of the process 800 can be implemented using one or more devices or systems that are communicatively coupled with one another, including client-server, cloud-based, or other network architectures.

At step 805, data for a new building device of a building can be received. The data can be received from a data source. For example, the data can be received from at least one of the data sources 112. The data can be received by an AI model. In some embodiments, the data can be received by at least one of the models described herein. For example, the second model(s) 116 can receive the data as an input. The data can include information describing the new building device. For example, the data can include a model number, a model type (e.g., an AHU, a chiller, a boiler, etc.), a location of the building device (e.g., where the building device is located in a building), a textual description of the device from a technician or building manager (e.g., the building device is a chiller and the chiller is located on floor 3 in the southwest corner of the building), and/or an image of the building device (e.g., a photo, a video, etc.).

The data can also include records, files, and/or among other possible information that indicate the new building device and/or new piece of building equipment. In some embodiments, the new building device can control an indoor environment of the building. In some embodiments, the data can include unstructured data that may conform to a plurality of different predetermined formats and/or the data may include unstructured data not conforming to a predetermined format. The data can also include one or more of a building information model (BIM) of the building, a building specification for the building, specifications of building materials of the building. For example, the data can include building metrics and/or floor layouts that can be used to provide an overall description of the placement of the new building device within the building.

In some embodiments, the second model(s) 116 can extract, from the data received in step 805, correlations between the data of the new building device and/or more existing building devices of the building. For example, the second model(s) 116 can compare timeseries data of the new building device with timeseries data of the existing building devices to detect and/or identify one or more matches (e.g., an existing building device is similar to the new building device). The second model(s) 116 can also determine that the new building device does not map to an existing building device (e.g., no matches).

In some embodiments, the second model(s) 116 can retrieve, from a database, information pertaining to the BMS of the building for which the new building device was added to (e.g., installed). The second model(s) 116 can analyze the BMS to detect and/or identify one or more equipment models for the new building device. For example, the second model(s) 116 can identify a pre-existing equipment model for the existing building device that matches the new building device (e.g., the new building device is a chiller, and the chiller matches an existing chiller of the building).

In some embodiments, the second model(s) 116 can determine that a pre-existing equipment model for the new building device is absent from the BMS (e.g., the BMS does not include an equipment model that relates to and/or pertains to the new building device).

At step 810, at least one new equipment model for the new building device or a new connector to integrate the new equipment model can be generated. The new equipment model and/or the new connector can be generated using an AI model. For example, the second model(s) 116 can generate the new equipment model. The connector can integrate the new building model and/or the new building device with other portions of the BMS. For example, the building device can include an AHU and the connector can indicate and/or map the AHU to given areas and/or zone of the building (e.g., the AHU services zones 1 and 2 of floor 3 and the AHU includes and/or produces this type of timeseries data). The connector can integrate the new building device with other portions of the BMS by at least one of routing, mapping, directing, and/or otherwise connecting the equipment model with one or more other models and/or assets of the BMS.

In some embodiments, generating the new equipment model or the new connector can include identifying one or more information sources relating to the new building device. The AI model can use the data received in step 805 to identify the one or more information sources. For example, the data received in step 805 can include a model number and the AI model can search the BMS of the building to see if an existing piece of building equipment has a similar model number. The AI model can, responsive to identifying an existing piece of building equipment having a similar model number, detect and/or identify an equipment model for the existing piece of building equipment. In some embodiments, the AI model may not identify an existing building model. The AI model can also access third-party information and/or publicly available information that relates to the new building device. For example, the AI model can identify a manufacturer of the new building device and the AI model can retrieve, from the manufacture's website, a manual and/or a spec sheet for the new building device.

In some embodiments, the AI model may identify correlations between third-party pieces of building equipment and pieces of building represented by one or more equipment models. For example, the AI model may identify that a given third-party piece of building equipment is a VAV. The AI model may identify correlations between the third-party VAV and pieces of equipment represented by the equipment models. For example, the AI model may compare information associated with the third-party VAV with information associated with one or more VAV's that include equipment models. In some embodiments, the AI model may identify correlations by generating predictions regarding what type of information and/or how the third-party VAV may perform in the building.

In some embodiments, generating the equipment model or the new connector can include extracting data from one or more information sources and utilizing the extracted data to generate at least one of the new equipment model or the new connector. For example, the AI model can identify a manufacturer of the new building device and extract (e.g., pull from) a website of the manufacturer an equipment model and/or an indication of the equipment model for the new building device. The AI model can then generate the new equipment model for the new building device based on the data received in step 805 and/or the equipment model retrieved form the website.

In some embodiments, the new equipment model and/or the new connector can be generated in a predetermined format. For example, the new equipment model and/or the new connector can be generated in a format that matches and/or can be utilized withing the BMS of the building. For example, the BMS of the building may include a given building schema (e.g., BRICK, Haystack, etc.) and/or utilize the given building schema. The generated equipment model can correspond to and/or integrate with the given building schema.

At step 815, one or more actions for the building can be performed using the equipment model or the connector. In some embodiments, the AI model can use the equipment model, or the connector generated in step 810 to perform one or more actions of the building. For example, the AI model can utilize the connector between the equipment model and the building to control an environmental condition of the building. To continue this example, the new equipment model may be for a lighting system and the connector can connect the lighting system to a given room of the building. The AI model can use the equipment model to adjust the lighting level of the given room by generating and/or providing signals to the lighting system based on the equipment model.

In some embodiments, the AI model described herein can include a generative AI model, such as a generative large language model (LLM). In some embodiments, the AI model can be configured to generate part or all of new models or model configurations that are not preexisting at the time of receipt of the data from a new device. In some embodiments, the AI model can be configured to identify a preexisting equipment model or characteristics/parameters of a new equipment model without express identifiers of the model in the underlying data, such as by analyzing the output data from the equipment, contextual data about the equipment or other equipment, or other types of data.

In some embodiments, the AI model can additionally or alternatively provide responses that are text based responses that provide useful and relevant information. In some embodiments, the AI model can include a generative pre-trained transformer (GPT) model. For example, the AI model can be trained to covert an input sequence (e.g., a prompt provided by the user via the building model generator application 120) into a modified input sequence. To continue this example, the AI model may receive a prompt including the sequence "I want to generate" and the AI model can generate probability scores for what the rest of the prompt may include (e.g., 95% that the prompt will be "I want to generate an equipment model").

In some embodiments, the AI model can generate a natural language summary of the generated equipment model and/or connector for the equipment model. The natural language summary may be for presentation to a user. For example, the natural language summary can be provided to the user via the BMS format integrator application 120. In some embodiments, the generative LLM can dynamically generate the natural language summary without user intervention. For example, the AI model and/or the generative LLM can generate the natural language summary in conjunction with and/or along with generating the equipment model and/or the connector for the equipment model without receiving information from the user regarding the natural language summary.

In some embodiments, generating the new equipment model and/or the connector can include generating at least one of a plurality of candidates or a plurality of prompts. For example, the AI model generate and/or identify a plurality of equipment models (e.g., candidates) for the new building device and the candidates can be provided, via the applications 120, to a user for selection. The user selection (e.g., a candidate) can be established by the AI model as the equipment model for the new building device.

Figure 9:
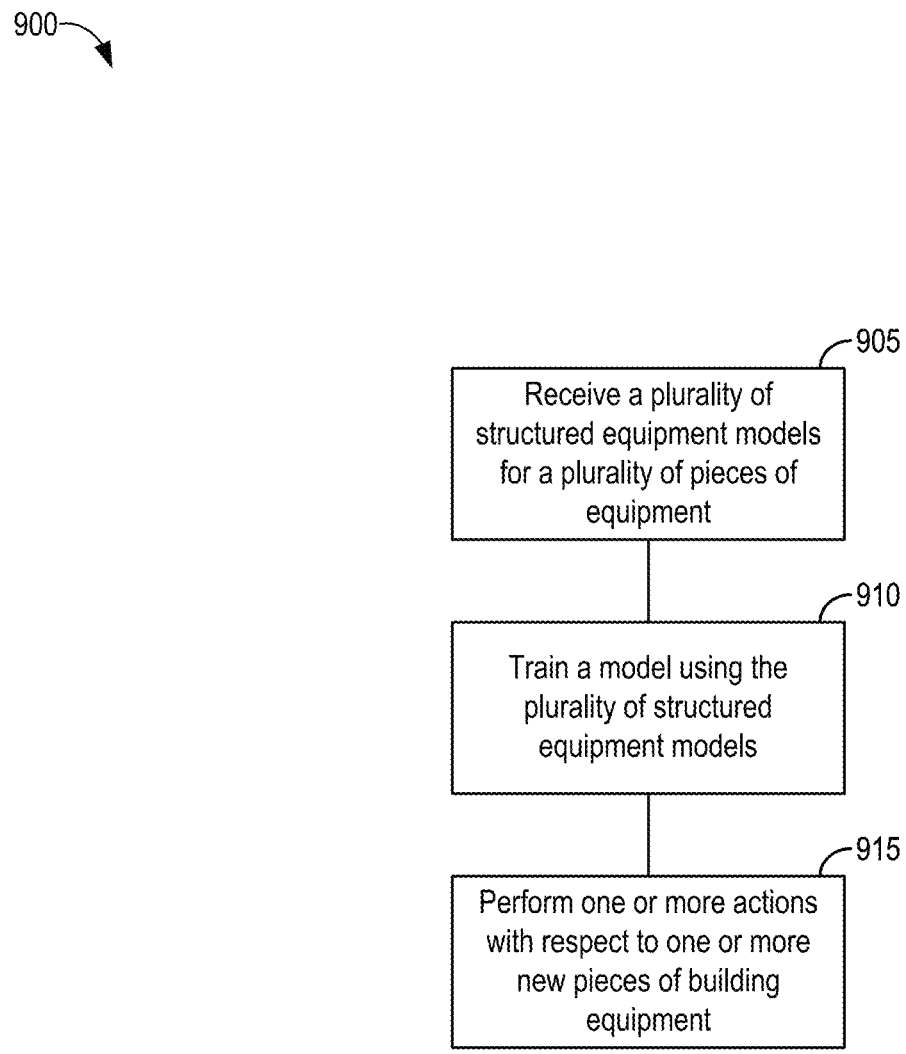
FIG. 9 is a flow diagram of a process of training a machine learning model for equipment models for pieces of building equipment.

FIG. 9 depicts an example of a process 900. The process 900 can be performed using various devices and/or systems described herein, including but not limited to the system 100, the system 200, and/or one or more components thereof. Various aspects of the process 900 can be implemented using one or more devices or systems that are communicatively coupled with one another, including client-server, cloud-based, or other network architectures. Additionally, at least one step of the process 900 can be performed and/or executed to generate and/or otherwise train a ML model to generate and/or detect equipment models for pieces of building equipment and/or building devices. For example, the process 900 can be used to generate ML models and the ML models may then perform one or more steps of the process 800.

At step 905, a plurality of structured equipment models for a plurality of pieces of building equipment can be received. The plurality of structured equipment models can be training data. The plurality of structured equipment models can be provided as training data to a model (e.g., the training data is inputted into the model). For example, the plurality of structured equipment models can be inputted into the first model 104. The plurality of structured equipment models can include data similar to the multiple types of data described herein. The plurality of structured equipment models can be received from at least one of the data sources described herein. For example, the plurality of structured equipment models can be received from the BIM data 112.

In some embodiments, the plurality of structured equipment models can correspond to a plurality of pieces of building equipment. For example, the plurality of structured equipment models can correspond to control systems and/or control components of a building. The plurality of structured equipment models may also pertain to different types of building equipment (e.g., AHUs, chillers, VAVs, filtration systems, lighting systems, and/or various types of building equipment described herein). The plurality of structured equipment models can also include and/or identify which equipment models map to and/or are associated with which pieces of building equipment.

In some embodiments, the plurality of structured equipment models may conform to a plurality of different predetermined formats. The predetermined formats of the plurality of structured equipment models may include at least one of the multiple data formats described herein. For example, the plurality of structured equipment models may conform to and/or include data formats associated with various BIMs, BMSs, and/or BASs. The plurality of structured equipment models may also include structured data that does not conform to a predetermined format. For example, the structured data may include handwritten notes that include a list of equipment models and one or more pieces of building equipment associated with the equipment models.

At step 910, a model can be trained using the plurality of structured equipment models. For example, the model can be trained using the plurality of structured equipment models received in step 905. The model can be and/or include at least one of the models described herein. For example, the model can be the model 104. The model updater 108 can train the model using at least one of the techniques described herein. For example, the model updater 108 can provide building equipment information and/or data included with the structured equipment models received in step 905 to cause the model to generate an output (e.g., an equipment model for a piece of building equipment). The model can also be a generative AI model and the generative AI model can be trained using the plurality of structured equipment models.

At step 915, one more actions with respect to one or more pieces of building equipment can be performed.

The actions can be performed with respect to one or more new pieces of building equipment that are added to and/or installed in a building subsequent to training the model in step 910. For example, the actions can be performed responsive to a technician providing a prompt indicating the installation of a new piece of building equipment and/or the AI model trained in step 910 detecting the addition of the new piece of building equipment. The prompt can be provided to via at least one of the applications 120 (e.g., the building model generator 120, the BMS format integrator 120, etc.).

The prompt from a user (e.g., the technician) can indicate that the user would like to see one or more equipment models for the new piece of building equipment. For example, the prompt may include the user indicating that a new VAV has been installed in the building and that they would like to see one or more equipment models for the new VAV. The AI model can generate, responsive to receiving the prompt, a plurality of equipment models and/or a plurality of connectors for the equipment models. The actions can also include the AI model generating, detecting, and/or otherwise establishing one or more operational parameter setpoints for the equipment model.

Figure 10:
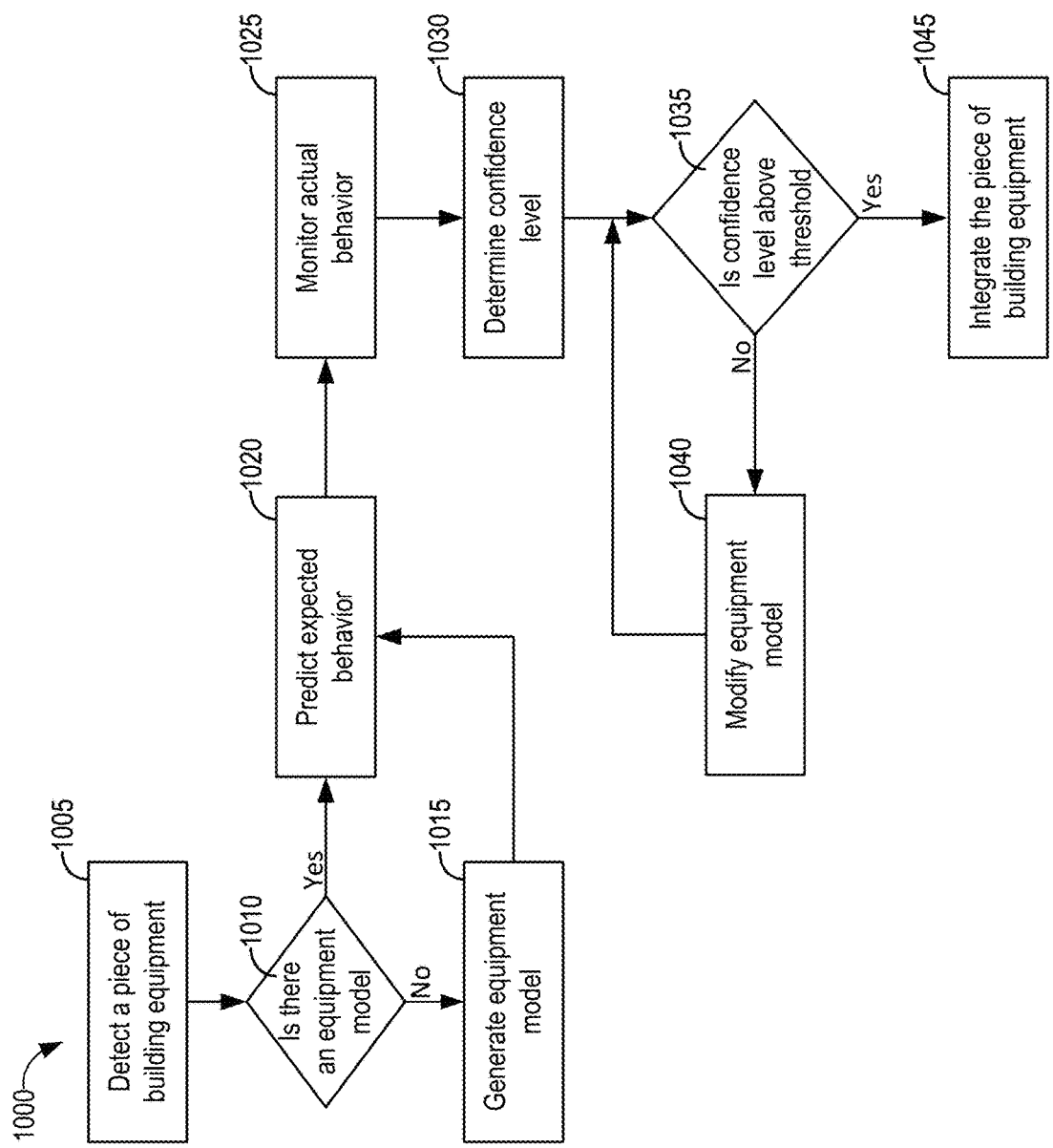
FIG. 10 is a flow chart of a process of integrating equipment models for pieces of building equipment.

FIG. 10 depicts a flow chart of a process 1000 for integrating one or more pieces of building equipment into a digital environment of a building. At least one step of the process 1000 can be performed using various devices and/or systems described herein, including but not limited to the system 100, the system 200, and/or one or more components thereof. Various aspects of the process 1000 can be implemented using one or more devices or systems that are communicatively coupled with one another, including client-server, cloud-based, or other network architectures. Additionally, at least one step of the process 1000 can be performed and/or executed by an AI model to integrate a building device into a BMS (e.g., a digital environment) of the building. For example, the models 104 can perform at least one step of the process 1000.

At step 1005, a piece of building equipment can be detected. For example, an AI model can receive a prompt a building manager indicated that a new piece of building equipment has been installed in a building. The prompt can be received via one of the applications 120. The prompt can be received by the 100 and the system 100 can provide the prompt to the model 104. The prompt may also include a request to generate an equipment model for the new piece of building equipment.

In some embodiments, the prompt can include additional information pertaining to the new piece of building equipment. For example, the prompt can include a model type and/or a model number for the new piece of building equipment. The prompt can include a textual summary, provided as a conversational input, of the new building equipment. For example, the user can provide "please generate an equipment model for an AHU with model number AFDC1873 that has been installed in zone 3 of the building" as conversational input to the AI model.

At step 1010, a determination can be made as to if there is an equipment model for the building equipment. For example, the AI model can use the information pertaining to the new building equipment received in step 1005 to determine that the new piece of building equipment has at least one equipment model. To continue this example, the AI model can determine the BMS of the building including the new piece of building equipment includes an equipment model associated with a similar piece of building equipment to that of the new piece of building equipment. The process 100 can move to step 1020 responsive to a determination that there is at least one equipment model for the new building equipment. The process 1000 can move to step 1015 responsive to a determination that there is not at least one equipment model for the new building equipment.

At step 1015, at least one equipment model for the new piece of building equipment can be generated. The AI model can generate the equipment model for the new piece of building equipment using at least one of the techniques described herein. For example, the AI model can retrieve an equipment model from a manufacturer's website. The AI model may also generate the equipment model by retrieving, from a publicly available resource, operational information pertaining to the new piece of building equipment (e.g., the new piece of building equipment produces this type of information, the new piece of building equipment receives this type of information, the new piece of building equipment can perform this set of operations and/or control actions, and/or among other possible types of information). For example, the AI model can use example timeseries data for the similar building equipment to that of the new building equipment to generate an equipment model for the new building equipment.

At step 1020, an expected behavior can be predicted. The expected behavior can be predicted by the AI model. The expected behavior can be predicted for the new piece of building equipment. For example, the AI model can predict performance metrics (e.g., runtime, control cycles, energy consumption, etc.) for the new piece of building equipment based on the equipment model. The expected behavior can also pertain to information and/or data that the AI model predicts that the new building equipment will produce and/or actions that the new building equipment can perform based on certain inputs (e.g., control signals, operational setpoints, etc.).

At step 1025, an actual behavior can be monitored. For example, the AI model can provide, to the new building equipment and/or the equipment model, a signal. The signal can be a control signal to the new building equipment and the AI model monitor the actions and/or performance of the new building device responsive to transmission of the control signal. The AI model can also perform a simulation of the new building equipment by providing signals to the equipment model and seeing what outputs are produced by the equipment model.

At step 1030, a confidence level can be determined. The confidence level can relate to the confidence the AI model has in the accuracy of the equipment model generated for and/or identified for the new building device. For example, the AI model can use the actual behavior of the building equipment and/or the equipment model from step 1025 to determine how well the equipment model correlates to the piece of building equipment. To continue this example, the AI model can determine and/or identify differences between the expected behavior of the new piece of building equipment predicted in step 1020 with the actual behavior monitored in step 1025. The AI model can use the differences to determine the confidence level.

In some embodiments, the confidence level determined by the AI model can be related to and/or proportional to a percent correctness between predicted behavior and modeled behavior. For example, the AI model can predict equipment cycles for the new piece of building equipment and the AI model can monitor the actual equipment cycles. To continue this example, the percent correctness may refer to the number of times that the AI model correctly predicted the equipment cycles (e.g., the predicted equipment cycles were similar to the actual equipment cycles). In some embodiments, a percent correctness of 85% may correlate to a confidence level of 8 (e.g., on a scale of 1-10). In some embodiments, the percent correctness of 85% may correlate to a confidence level of 98%.

At step 1035, a determination can be made as to if the confidence level is above a threshold. In some embodiments, the threshold can be a predetermined value and/or a predetermined threshold. The threshold may be established by the building manager of the building for which the new piece of building equipment was installed. The predetermined threshold of the building can determine and/or define a criteria and/or standard for when new pieces of building equipment can be integrated into the BMS of the building. The process 100 can move to step 1045 responsive to a determination that the confidence level is above the threshold. The process 1000 can move to step 1040 responsive to a determination that the confidence level is below the threshold.

At step 1040, the equipment model can be modified. For example, the AI model can adjust and/or change aspect of the equipment model for the new piece of building equipment. The AI model may also choose to replace the equipment model for the new piece of building equipment with a different equipment model. In some embodiments, the AI model may then determine and/or obtain a confidence level for the different equipment model. The process may then move to step 1035 and the confidence level for the difference equipment model can be compared to the threshold.

At step 1045, the piece of building equipment can be integrated. For example, the AI model can integrate the equipment model for the new piece of building equipment into the BMS of the building. The AI model may integrate the equipment model into the BMS by establishing, generating, and/or otherwise determining connectors and/or connections for the equipment model with one or more components and/or entities of the BMS.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

In various implementations, the steps and operations described herein may be performed on one processor or in a combination of two or more processors. For example, in some implementations, the various operations could be performed in a central server or set of central servers configured to receive data from one or more devices (e.g., edge computing devices/controllers) and perform the operations. In some implementations, the operations may be performed by one or more local controllers or computing devices (e.g., edge devices), such as controllers dedicated to and/or located within a particular building or portion of a building. In some implementations, the operations may be performed by a combination of one or more central or offsite computing devices/servers and one or more local controllers/computing devices. All such implementations are contemplated within the scope of the present disclosure. Further, unless otherwise indicated, when the present disclosure refers to one or more computer-readable storage media and/or one or more controllers, such computer-readable storage media and/or one or more controllers may be implemented as one or more central servers, one or more local controllers or computing devices (e.g., edge devices), any combination thereof, or any other combination of storage media and/or controllers regardless of the location of such devices.

What is claimed is:

1. A method comprising:
   identifying, by one or more processors of a building management system, a trigger indication to integrate a new physical building device of a building with the building management system;
   receiving, by the one or more processors, data for the new physical building device of the building;
   generating, by the one or more processors using an artificial intelligence (AI) model, a new equipment model for the new physical building device to integrate the new equipment model with other portions of the building management system, wherein generating one of the new equipment model comprises the AI model:
     identifying one or more information sources relating to the new physical building device using the data for the new physical building device;
     extracting data from the one or more information sources;
     determining, by the one or more processors using the AI model, that a preexisting equipment model for the new physical building device is absent from the building management system; and
     generating, by the one or more processors using the AI model responsive to determining that the preexisting equipment model for the new physical building device is absent from the building management system, the new equipment model for the new physical building device; and
   performing, by the one or more processors, one or more actions for the building responsive to the trigger indication to integrate the new physical building device of the building with the building management system based on the new equipment model generated using the AI model, wherein performing the one or more actions includes providing parameter setpoints or control signals for the new physical building device.

2. The method of claim 1, wherein the AI model comprises a generative large language model (LLM).

3. The method of claim 2, wherein the generative LLM comprises a generative pretrained transformer model.

4. The method of claim 1, wherein generating the new equipment model for the new physical building device is done autonomously and/or without manual user intervention.

5. The method of claim 1, wherein generating the new equipment model for the new physical building device includes:
   generating, by the one or more processors using the AI model, at least one of:
     candidates for user selection; or
     prompts for user selection.

6. The method of claim 2, wherein other data regarding the new physical building device includes at least one of:
   data indicating a building device type;
   data indicating a building device model; or
   data indicating operational information.

7. The method of claim 1, comprising:
   receiving, by the one or more processors, a plurality of structured equipment models corresponding to a plurality of pieces of building equipment for a plurality of buildings, the plurality of structured equipment models conforming to a plurality of different predetermined formats and/or comprising structured data not conforming to a predetermined format supported by the building management system; and
   training, by the one or more processors, the AI model using the plurality of structured equipment models to generate one or more new equipment models or one or more new connectors.

8. One or more non-transitory storage media storing instructions thereon that, when executed by one or more processors, cause the one or more processors to perform operations comprising:
   receiving a first plurality of structured equipment models corresponding to a first plurality of pieces of building equipment for a plurality of buildings, the first plurality of structured equipment models conforming to a plurality of different predetermined formats and/or comprising structured data not conforming to the plurality of different predetermined formats;
   training a generative artificial intelligence (AI) model using the first plurality of structured equipment models;
   identifying a trigger indication to integrate one or more new physical building devices of a building with a building management system;
   performing, using the generative AI model, one or more actions with respect to the one or more new physical building devices subsequent to training the generative AI model, wherein performing the one or more actions includes:
     identifying one or more information sources relating to the one or more new physical building devices;
     determining, using the generative AI model, that a preexisting equipment model for the one or more new physical building devices is absent from the building management system; and generating, using the generative AI model responsive to determining that the preexisting equipment model for the one or more new physical building devices is absent from the building management system, one or more new equipment models for the one or more new physical building devices; and performing one or more second actions for the building responsive to the trigger indication to integrate the one or more new physical building devices of the building with the building management system based on the one or more new equipment models generated using the generative AI model, wherein performing the one or more second actions includes providing parameter setpoints or control signals for the one or more new physical building devices.

9. The one or more non-transitory storage media of claim 8, wherein the one or more new equipment models conform to a predetermined format supported by the building management system that controls the one or more new physical building devices.

10. The one or more non-transitory storage media of claim 8, wherein the instructions cause the one or more processors to perform operations comprising:

receiving data for the one or more new physical building devices; and generating, using the generative AI model, one or more new connectors to integrate the one or more new equipment models with the building management system.

11. The one or more non-transitory storage media of claim 8, wherein the generative AI model comprises a generative pretrained transformer model.

12. The one or more non-transitory storage media of claim 8, wherein generating the one or more new equipment models for the one or more new physical building devices is done autonomously and/or without manual user intervention.

13. The one or more non-transitory storage media of claim 8, wherein generating the one or more new equipment models for the one or more new physical building devices includes:

generating, using the generative AI model, at least one of:
candidates for user selection; or
prompts for user selection.

14. A system comprising one or more memory devices storing instructions thereon that, when executed by one or more processors, cause the one or more processors to:

identify a trigger indication to integrate a new physical building device of a building with a building management system;

receive data for the new physical building device of the building;

generate, using an artificial intelligence (AI) model, a new connector to integrate other data regarding the new physical building device with other portions of the building management system, wherein generation of the new connector comprises the AI model:

identifying one or more information sources relating to the new physical building device using the data for the new physical building device;

extracting data from the one or more information sources;

determining, using the AI model, that a connector for the new physical building device is absent from the building management system; and generating, using the AI model responsive to determining that the connector for the new physical building device is absent from the building management system, the new connector for the new physical building device; and perform one or more actions for the building responsive to the trigger indication to integrate the new physical building device of the building with the building management system based on the new connector generated using the AI model, wherein performing the one or more actions includes providing parameter setpoints or control signals for the new physical building device.

15. The system of claim 14, wherein the AI model comprises a generative large language model (LLM).

16. The system of claim 15, wherein the generative LLM comprises a generative pretrained transformer model.

* * * * *